(12) United States Patent
Hatade

(10) Patent No.: US 7,652,350 B2
(45) Date of Patent: Jan. 26, 2010

(54) SEMICONDUCTOR DEVICE

(75) Inventor: Kazunari Hatade, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 603 days.

(21) Appl. No.: 11/461,598

(22) Filed: Aug. 1, 2006

(65) Prior Publication Data
US 2007/0176205 A1 Aug. 2, 2007

(30) Foreign Application Priority Data
Jan. 31, 2006 (JP) ............................. 2006-022721

(51) Int. Cl.
*H01L 29/745* (2006.01)
(52) U.S. Cl. ................. 257/579; 257/197; 257/198; 257/273; 257/E29.027; 257/E29.197
(58) Field of Classification Search ............. 257/273, 257/579, E29.027, 197, 198, E29.197
See application file for complete search history.

(56) References Cited

U.S. PATENT DOCUMENTS

| | | |
|---|---|---|
| 5,023,691 A | 6/1991 | Hagino |
| 5,170,239 A | 12/1992 | Hagino |
| 5,391,898 A | 2/1995 | Hagino |
| 5,654,561 A | 8/1997 | Watabe |
| 5,869,850 A * | 2/1999 | Endo et al. .................. 257/139 |
| 6,191,456 B1 | 2/2001 | Stoisiek et al. |
| 6,650,001 B2 | 11/2003 | Yamaguchi et al. |

FOREIGN PATENT DOCUMENTS

| | | |
|---|---|---|
| DE | 198 28 669 A1 | 1/2000 |
| DE | 690 34 157 T2 | 9/2005 |
| JP | 9-148574 | 6/1997 |
| JP | 2000-286416 | 10/2000 |

OTHER PUBLICATIONS

U.S. Appl. No. 11/554,659, filed Oct. 31, 2006, Hatade.

* cited by examiner

*Primary Examiner*—Zandra Smith
*Assistant Examiner*—Minchul Yang
(74) *Attorney, Agent, or Firm*—Oblon, Spivak, McClelland, Maier & Neustadt, L.L.P.

(57) ABSTRACT

A semiconductor device including a horizontal unit semiconductor element, the horizontal unit semiconductor element including: a) a semiconductor substrate of a first conductivity type; b) a semiconductor region of a second conductivity type formed on the semiconductor substrate; c) a collector layer of the first conductivity type formed within the semiconductor region; d) a base layer of the first conductivity type having an endless shape and formed within the semiconductor region such that the base layer is off the collector layer but surrounds the collector layer; and e) a first emitter layer of the second conductivity type formed in the base layer, the horizontal unit semiconductor element controlling, within a channel region formed in the base layer, movement of carriers between the first emitter layer and the collector layer, wherein the first emitter layer is formed by plural unit emitter layers which are formed along the base layer.

10 Claims, 33 Drawing Sheets

SEMICONDUCTOR DEVICE

CROSS-REFERENCE TO RELATED APPLICATION

The disclosure of Japanese Patent Application No. 2006-22721 filed on Jan. 31, 2006 including specification, drawings and claims is incorporated herein by reference in its entirely.

BACKGROUND OF THE INVENTION

1. Field of the Invention

The present invention relates to a semiconductor device, and more particularly, to a high-voltage power semiconductor device.

2. Description of the Related Art

FIG. 30 is a top view of a conventional horizontal n-channel IGBT (Insulated Gate Bipolar Transistor) generally denoted at 1000. FIG. 31 is a cross sectional view of FIG. 30 taken along the direction X-X.

As shown in FIG. 31, the IGBT 1000 includes a p-type substrate 1. The p-type substrate 1 seats an n− layer 2 in which an n-type buffer layer 3 is formed. There is a p-type collector layer 4 in the n-type buffer layer 3.

A p-type base layer 5 is formed in the n− layer 2, over a predetermined distance from the p-type collector layer 4. In the p-type base layer 5, an n-type emitter layer (n+) 6 is formed so that it is on the inner side relative to a peripheral portion of the p-type base layer 5 and shallower than the p-type base layer 5. A p-type emitter layer (p+) 7 as well is formed in the p-type base layer 5.

A field oxide film 8 is formed on the surface of the n− layer 2 which is located between the n-type buffer layer 3 and the p-type base layer 5. On a channel region 15 formed in the p-type base layer 5 and located between the emitter layer 6 and the n− layer 2, a gate wire 10 is disposed via a gate oxide film 9. Further, there is a protection film 11 which is disposed covering the field oxide film 8, etc.

A gate electrode 12 is disposed such that it is electrically connected with the gate wire 10. An emitter electrode 13 is further disposed such that it is electrically connected with both the n-type emitter layer 6 and the p-type emitter layer 7. In addition, a collector electrode 14 is disposed such that it is electrically connected with the p-type collector layer 4. The emitter electrode 13, the collector electrode 14 and the gate electrode 12 are electrically isolated from each other.

As shown in FIG. 30, the p-type collector layer 4 is located at the center of the IGBT 1000 in which structure the n-type buffer layer 3, the n− layer 2, the p-type base layer 5, the n-type emitter layer 6 and the p-type emitter layer 7 surround the p-type collector layer 4 in this order, and this structure has an endless shape which is defined by connecting two semi-circular sections by straight sections. For easy understanding, FIG. 30 omits the field oxide film 8, the gate oxide film 9, the gate wire 10, the gate electrode 12, the protection film 11, the emitter electrode 13 and the collector electrode 14 (Japanese Patent No. 3647802).

FIG. 32 shows a collector-emitter current (ICE) characteristic which the IGBT 1000 exhibits upon application of a collector-emitter voltage (VCE) in a condition that a constant gate-emitter voltage (VGE) is applied upon the IGBT 1000. The collector-emitter voltage (VCE) is measured along the horizontal axis, whereas the vertical axis denotes the collector-emitter current (ICE) A room temperature is a temperature for measurement.

From FIG. 32, one can see that as VCE gradually rises, ICE becomes approximately 0.2 A when VCE reaches 6V or becomes close to 6V and beyond this, ICE tends to get saturated. This causes a problem that however high VCE becomes, ICE will not become sufficiently large.

There is another problem that as the gradient expressing ICE remains moderate while VCE grows from 0V to 6V and the ON-resistance (VCE/ICE) is therefore high.

FIG. 33 shows the turn-off waveform of the IGBT 1000. The turn-off time is measured along the horizontal axis and the collector-emitter voltage (VCE) or the collector-emitter current (ICE) is measured along the vertical axis. In FIG. 33, the symbol (AV) denotes changes of the VCE value and the symbol (AI) denotes changes of the ICE value.

As one can tell from FIG. 33, the fall time (i.e., the time needed for ICE to come down to 10% from 90% of the maximum value) has a large value exceeding 1 µs. The junction-isolated (JI) horizontal IGBT 1000 in which the IGBT is formed in the n− layer 2 on the p-type substrate 1 thus has problem that its switching speed is slow and it has a large switching loss.

The horizontal IGBT 1000 has a further problem that at short-circuit in an inverter circuit or the like latches up a parasitic thyristor which is formed by the p-type collector layer 4/the n-type buffer layer 3/the n− layer 2/the p-type base layer 5/the n-type emitter layer 6 and increases the current density of the IGBT 1000 so that the IGBT may get destroyed easily.

SUMMARY OF THE INVENTION

The present invention has been made to solve these problems, and accordingly, an object of the present invention is to provide a semiconductor device which exhibits an improved collector-emitter current characteristic, shortens the fall time and increases the latch-up tolerance of a parasitic thyristor.

The present invention is directed to a semiconductor device including a horizontal unit semiconductor element, the horizontal unit semiconductor element including: a) a semiconductor substrate of a first conductivity type; b) a semiconductor region of a second conductivity type formed on the semiconductor substrate; c) a collector layer of the first conductivity type formed within the semiconductor region; d) a base layer of the first conductivity type having an endless shape and formed within the semiconductor region such that the base layer is off the collector layer but surrounds the collector layer; and e) a first emitter layer of the second conductivity type formed in the base layer, the horizontal unit semiconductor element controlling, within a channel region formed in the base layer, movement of carriers between the first emitter layer and the collector layer, wherein the first emitter layer is formed by plural unit emitter layers which are formed along the base layer.

According to the present invention, it is possible to obtain a semiconductor device which exhibits an excellent collector-emitter current characteristic and has a short fall time and in which the latch-up tolerance of a parasitic thyristor is high.

DETAILED DESCRIPTION OF THE PREFERRED EMBODIMENTS

Embodiment 1

Figure 1:
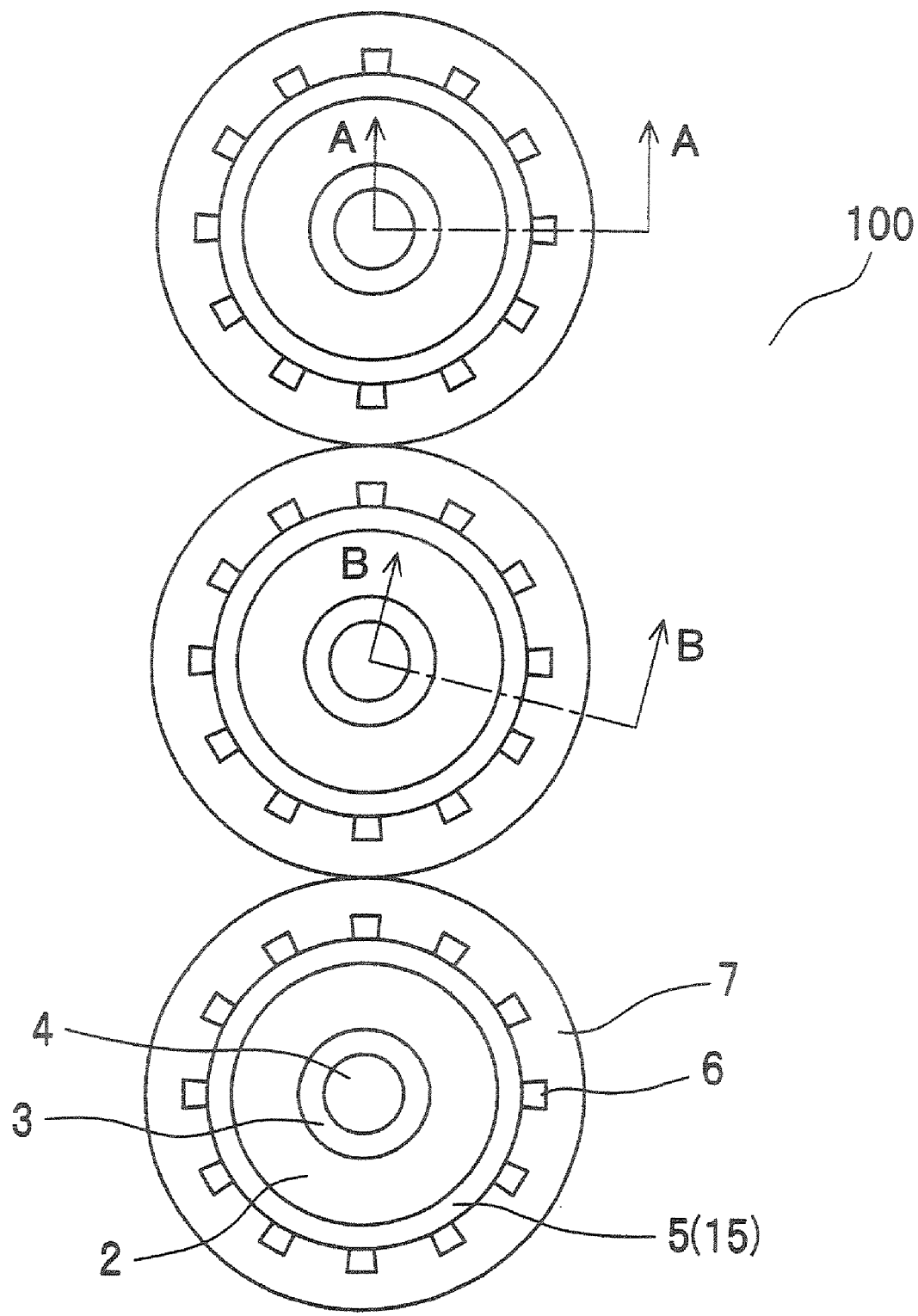
FIG. 1 is a top view of an IGBT according to an Embodiment 1 of the present invention.
Figure 2:
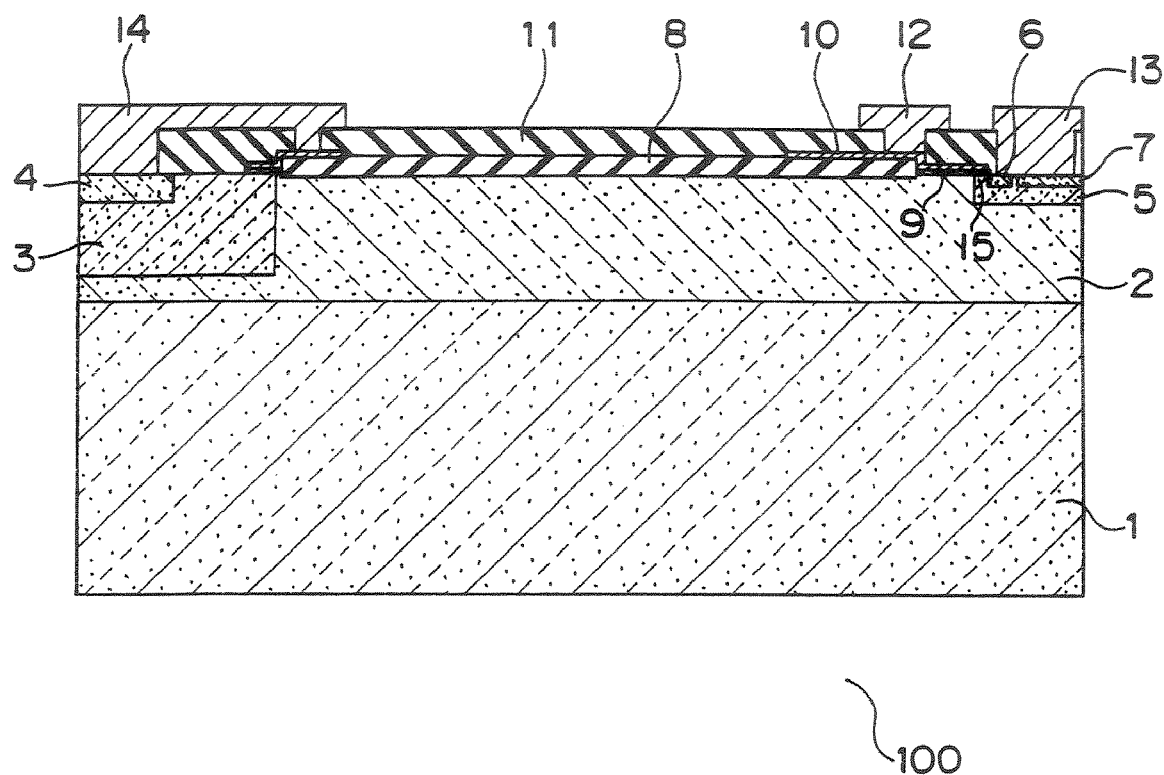
FIG. 2 is a cross sectional view of the IGBT according to the Embodiment 1 of the present invention.
Figure 3:
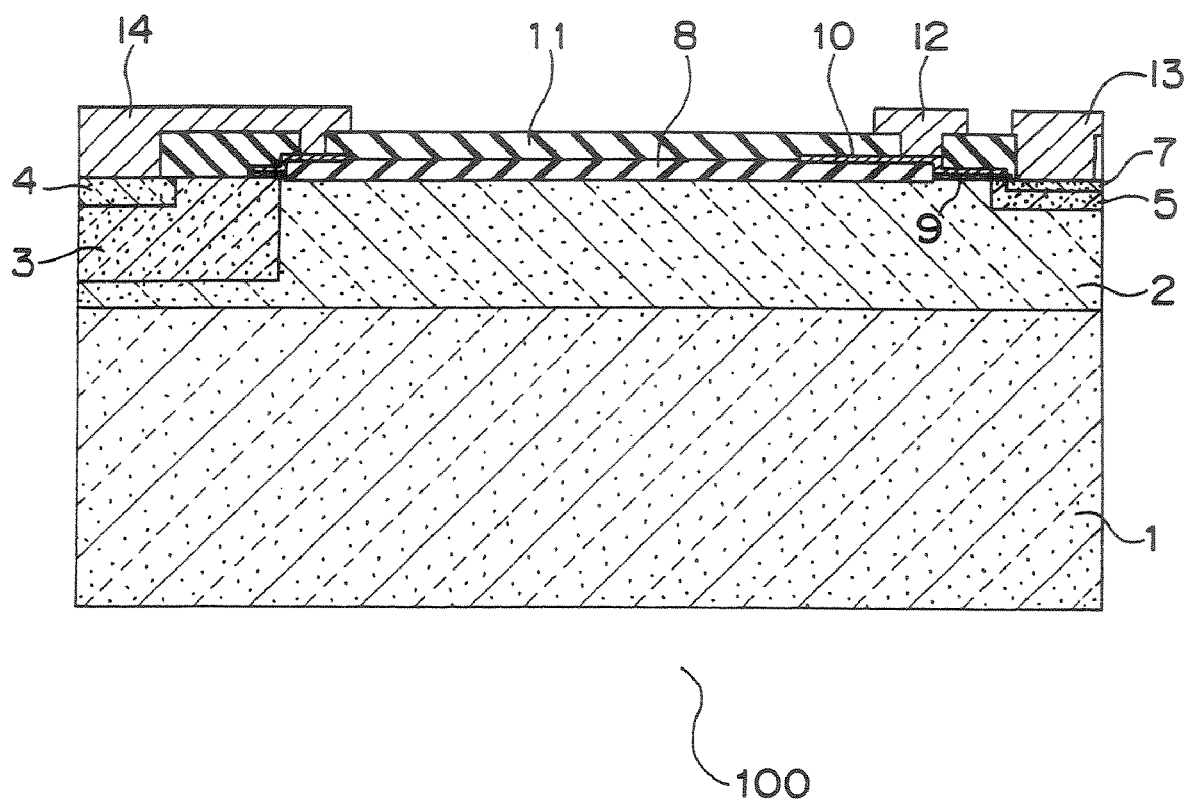
FIG. 3 is a cross sectional view of the IGBT according to the Embodiment 1 of the present invention.

FIG. 1 is a top view of a horizontal n-channel IGBT (Insulated Gate Bipolar Transistor) according to the Embodiment 1 of the present invention generally denoted at 100. FIG. 2 is a cross sectional view of FIG. 1 taken along the direction A-A, while FIG. 3 is a cross sectional view of FIG. 1 taken along the direction B-B.

As shown in FIG. 1, multiple circular unit IGBTs are disposed next to each other in the IGBT 100 (In FIG. 1, there are three unit IGBTs.). In each unit IGBT, a p-type collector layer 4 is located at the center, and an n-type buffer layer 3, an n− layer 2 and a p-type base layer 5 are disposed in an approximately concentric arrangement around the p-type collector layer 4. Disposed around the p-type base layer 5 are plural n-type emitter layers (unit emitter layers) 6 which are shaped like stripes in such a manner that the n-type emitter layers are apart from each other in an approximately concentric arrangement, and the p-type base layer 5 located between the n− layer 2 and the emitter layers 6 serve as a channel region 15. The emitter layers 6 are preferably disposed equidistant from each other. Further, there is a p-type emitter layer 7 around the emitter layers 6.

The emitter layers 6 may be formed so as to discontinuously surround the channel region 15, and may for example be shaped like trapezoids, fans, etc.

As for the cross sectional structure of the IGBT 100 taken along the direction A-A, the IGBT 100 includes a p-type substrate 1 of silicon or the like as shown in FIG. 2. The n− layer 2 is formed on the p-type substrate 1. The n-type buffer layer 3 is selectively formed in the n− layer 2. In addition, the p-type collector layer 4 is selectively formed in the n-type buffer layer 3.

The n-type buffer layer 3 may be omitted (This similarly applies also to the embodiments described below.).

In the n− layer 2, the p-type base layer 5 is selectively formed in over a predetermined distance from the p-type collector layer 4. In the p-type base layer 5, the n-type emitter layers (n+) 6 are selectively formed so that they are located on the inner side relative to a peripheral portion of the p-type base layer 5 and shallower than the p-type base layer 5. A p-type emitter layer (p+) 7 as well is formed in the p-type base layer 5.

A field oxide film 8 which may be a silicon oxide film for instance is formed on the surface of the n− layer 2 which is located between the n-type buffer layer 3 and the p-type base layer 5. On a channel region 15 formed in the p-type base layer 5 and located between the emitter layer 6 and the n− layer 2, a gate wire 10 is disposed via a gate oxide film 9 which may be a silicon oxide film for example. Further, a protection film 11 which may be a silicon nitride film for instance is disposed covering the field oxide film 8, etc.

A gate electrode 12 is disposed such that it is electrically connected with the gate wire 10. The gate electrode 12 is made of aluminum for example.

An emitter electrode 13 is further disposed such that it is electrically connected with both the n-type emitter layers 6 and the p-type emitter layer 7. In addition, a collector electrode 14 is disposed such that it is electrically connected with the p-type collector layer 4. The emitter electrode 13 and the collector electrode 14 are made of aluminum for instance.

The emitter electrode 13, the collector electrode 14 and the gate electrode 12 are electrically isolated from each other.

With respect to the cross sectional structure of the IGBT 100 taken along the direction B-B, there is no n-type emitter layer 6 in the p-type base layer 5 and the p-type emitter layer 7 extends contacting the entire bottom surface of the emitter electrode 13, as shown in FIG. 3. The structure is otherwise similar to that shown in the cross sectional view in FIG. 2.

Figure 4:
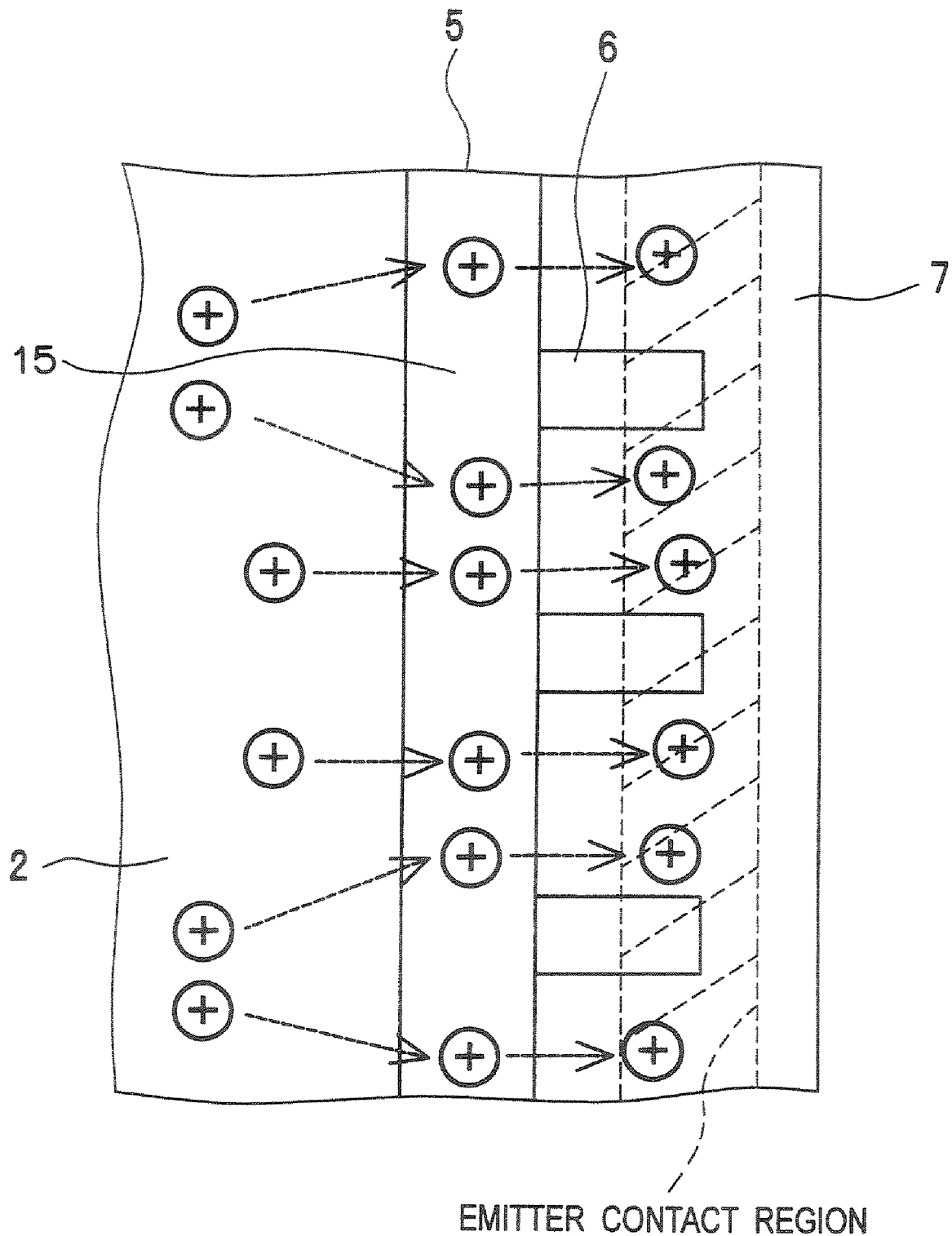
FIG. 4 is a schematic diagram which shows movement of holes in the vicinity of an emitter electrode within the IGBT according to the Embodiment 1 of the present invention.

FIG. 4 is a schematic diagram which shows movement of holes in the vicinity of the emitter electrode within the IGBT 100. In FIG. 4, the same reference symbols as those appearing in FIG. 1 denote the same or corresponding portions. In the IGBT 100, the stripe-like n-type emitter layers (unit emitter layers) 6 are disposed at predetermined intervals so as to discontinuously surround the channel region 15. In this structure, at the time of turning off or during the steady ON-state, it is easier for holes to flow into the emitter electrode via the p-type emitter layer 7 which is located between the discontinuously disposed n-type emitter layers 6 (or via the p-type base layer 5 which is below the p-type emitter layer 7), rather than flowing to immediately below the n-type emitter layers 6. In short, extremely few holes flow to immediately below the n-type emitter layers 6.

This suppresses operations of a parasitic npn bipolar transistor formed by the n− layer 2/the p-type base layer 5/the n-type emitter layers 6 and eventually prevents latching up of a parasitic thyristor formed by the p-type collector layer 4/the n-type buffer layer 3/the n− layer 2/the p-type base layer 5/the n-type emitter layers 6.

The IGBT 100 according to the Embodiment 1 of the present invention thus improves the latch-up tolerance of a parasitic thyristor at the time of turning off of the IGBT 100 or during the steady ON-state of the IGBT 100.

In such a structure as that of the IGBT 100 which includes the p-type emitter layer (p+) 7, since the emitter electrode contacts the p-type emitter layer 7, the contact resistance in the emitter contact region is lower than in a structure as that of an IGBT 150 which will be described later wherein there is no p-type emitter layer 7 and the emitter electrode contacts the p-type base layer 5 directly.

Hence, at the time of turning off or during the steady ON-state, holes more easily flow to the emitter electrode via the p-type emitter layer 7 located between the n-type emitter layers 6 (or via the p-type base layer 5 which is below the p-type emitter layer 7), rather than flowing to immediately below the n-type emitter layers 6. It is therefore possible to effectively prevent latching up of a parasitic thyristor formed by the p-type collector layer 4/the n-type buffer layer 3/the n− layer 2/the p-type base layer 5/the n-type emitter layers 6.

Figure 5:
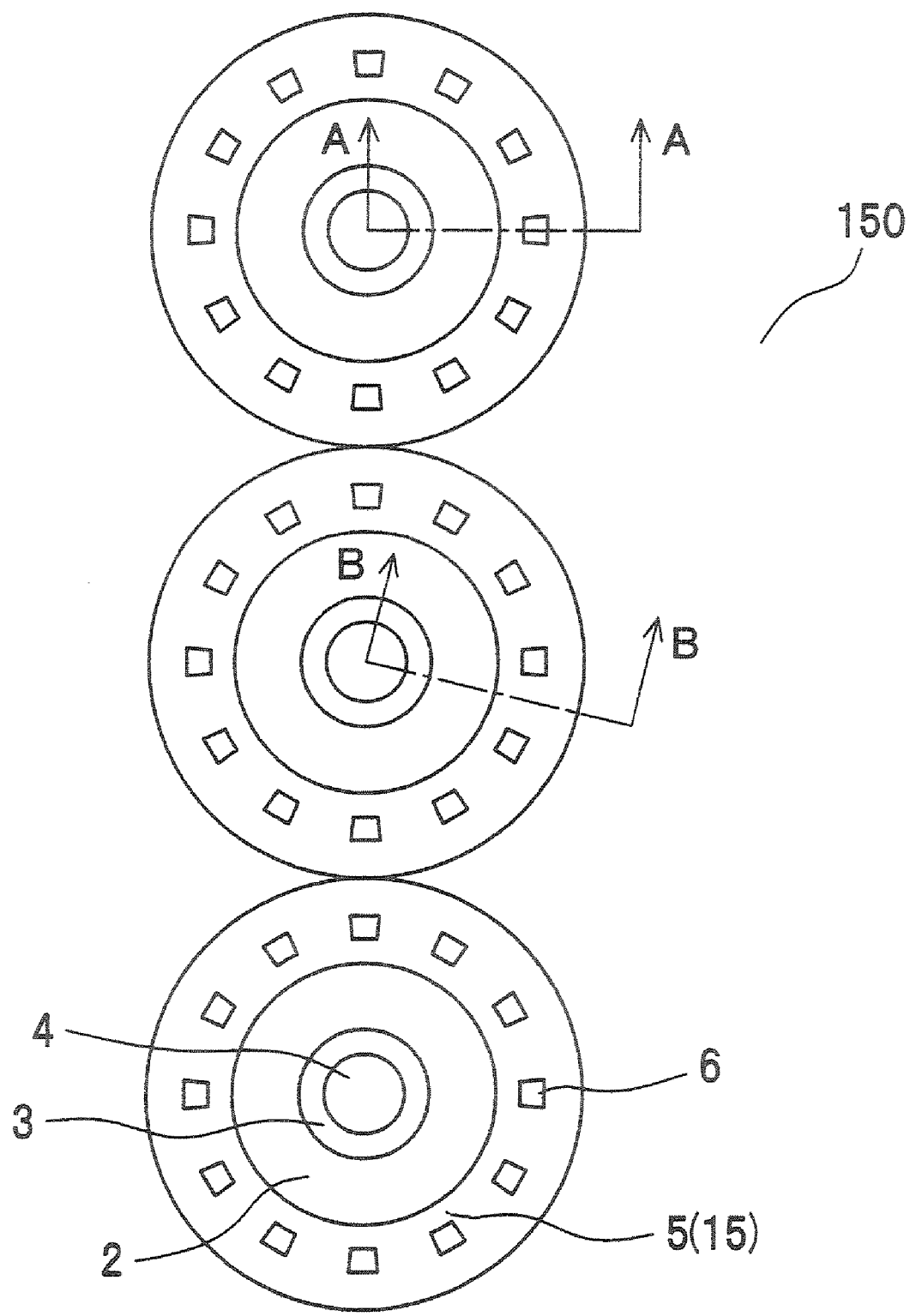
FIG. 5 is a top view of another IGBT according to the Embodiment 1 of the present invention.
Figure 6:
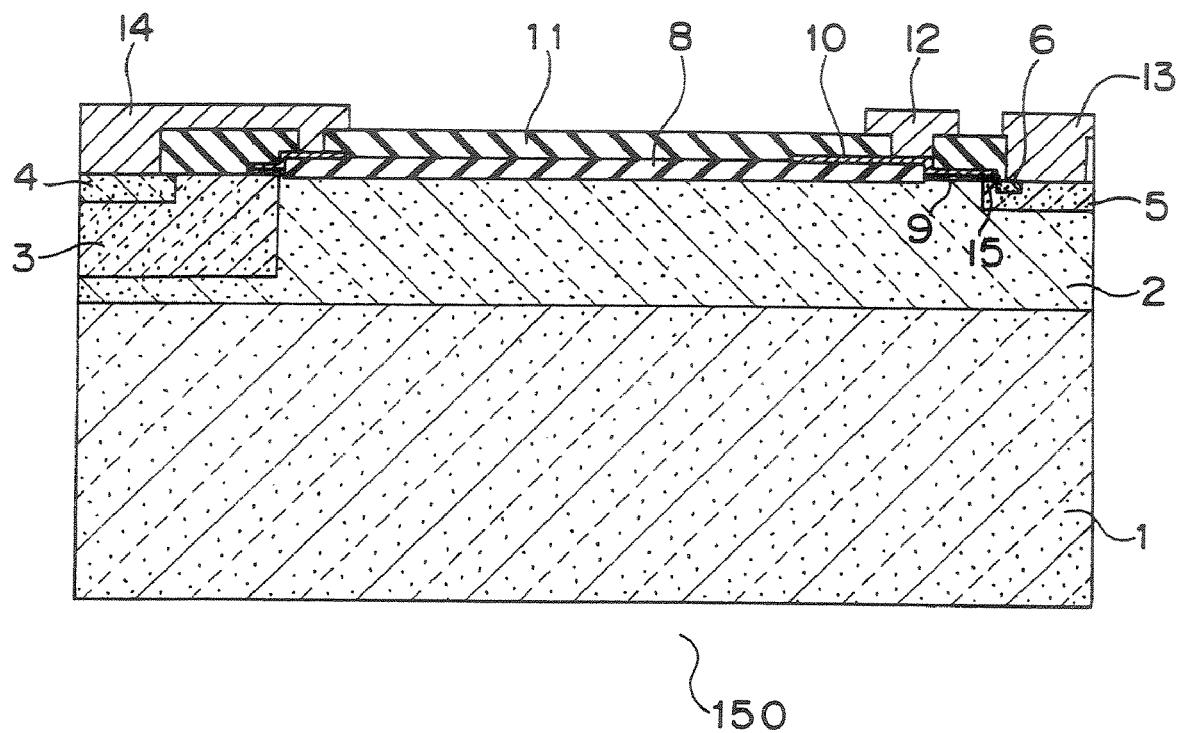
FIG. 6 is a cross sectional view of another IGBT according to the Embodiment 1 of the present invention.

FIG. 5 is a top view of another horizontal n-channel IGBT according to the Embodiment 1 of the present invention generally denoted at 150. FIG. 6 is a cross sectional view of FIG. 5 taken along the direction A-A, while FIG. 7 is a cross sectional view of FIG. 5 taken along the direction B-B.

Figure 7:
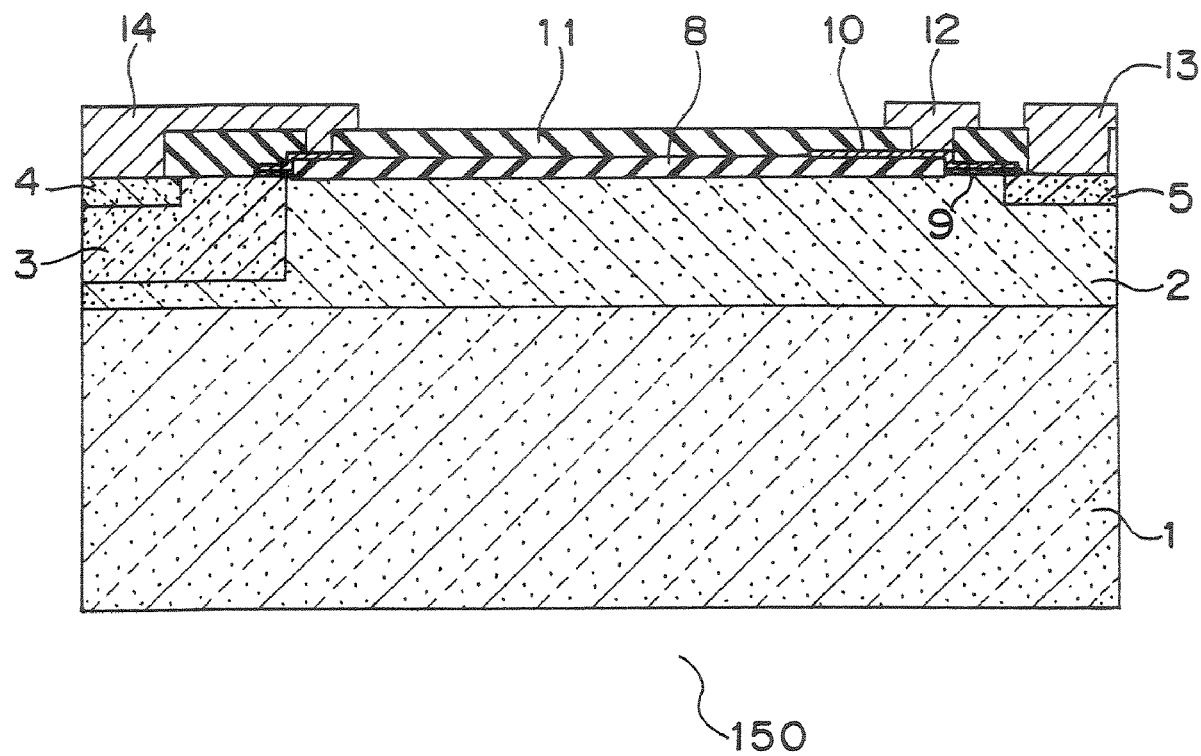
FIG. 7 is a cross sectional view of another IGBT according to the Embodiment 1 of the present invention.

In FIGS. 5 through 7, the same reference numerals as those appearing in FIGS. 1 through 3 denote the same or corresponding portions.

As one can tell from FIGS. 5 through 7, the IGBT 150 has a structure which does not have the p-type emitter layer 7, unlike the IGBT 100. The structure is otherwise the same as that of the IGBT 100.

In this structure as well, as in the IGBT 100 described above, at the time of turning off or during the steady ON-state, holes more easily flow to the emitter electrode via the p-type base layer 5 located between the n-type emitter layers 6, rather than flowing to immediately below the n-type emitter layers 6. It is therefore possible to effectively prevent latching up of a parasitic thyristor formed by the p-type collector layer 4/the n-type buffer layer 3/the n− layer 2/the p-type base layer 5/the n-type emitter layers 6.

Including no p-type emitter layer 1, the IGBT 150 is manufactured through simpler steps than steps for manufacturing the IGBT 100 which includes the p-type emitter layer 7.

Figure 8:
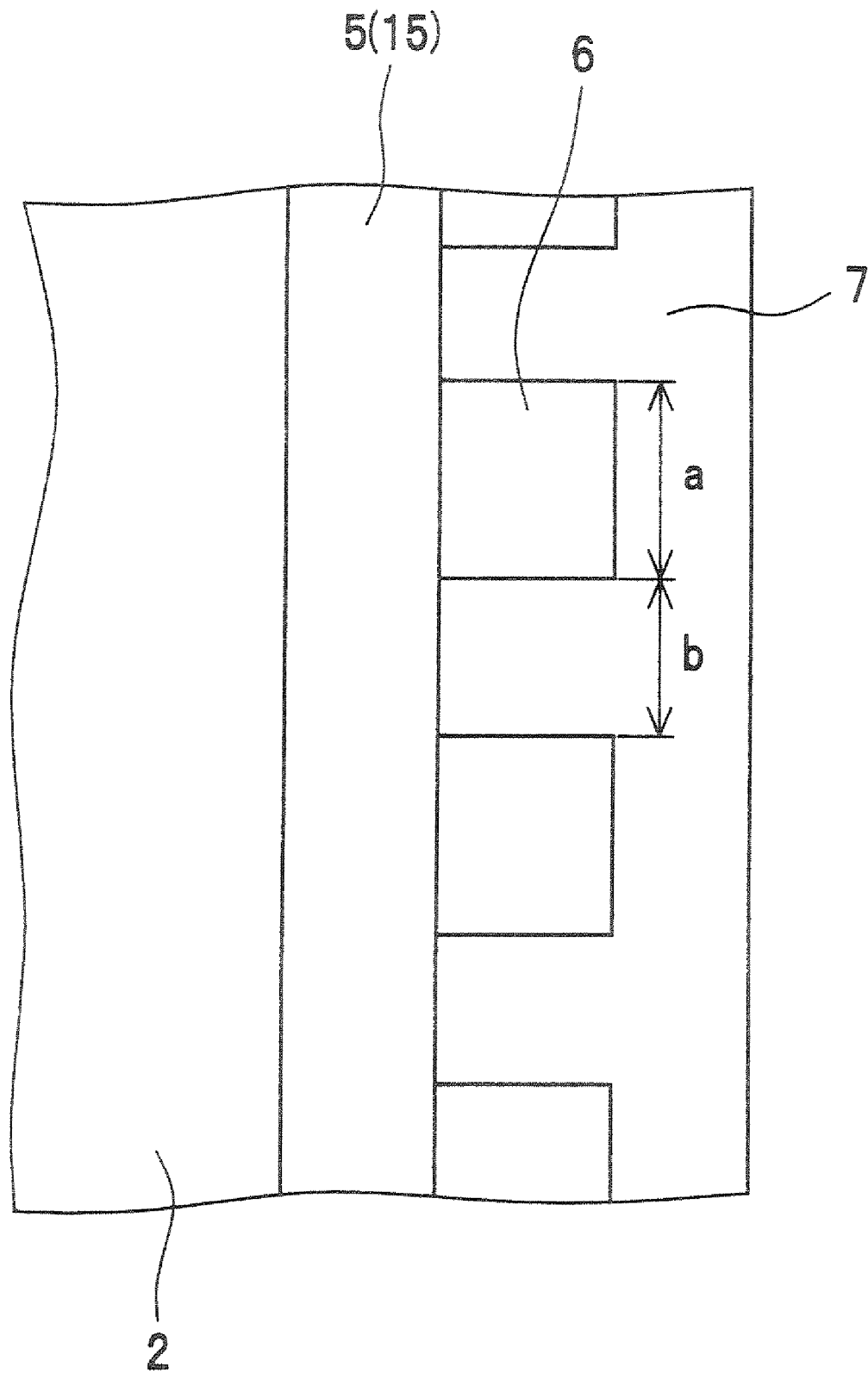
FIG. 8 is a partial top view of the IGBT according to the Embodiment 1 of the present invention.
Figure 9:
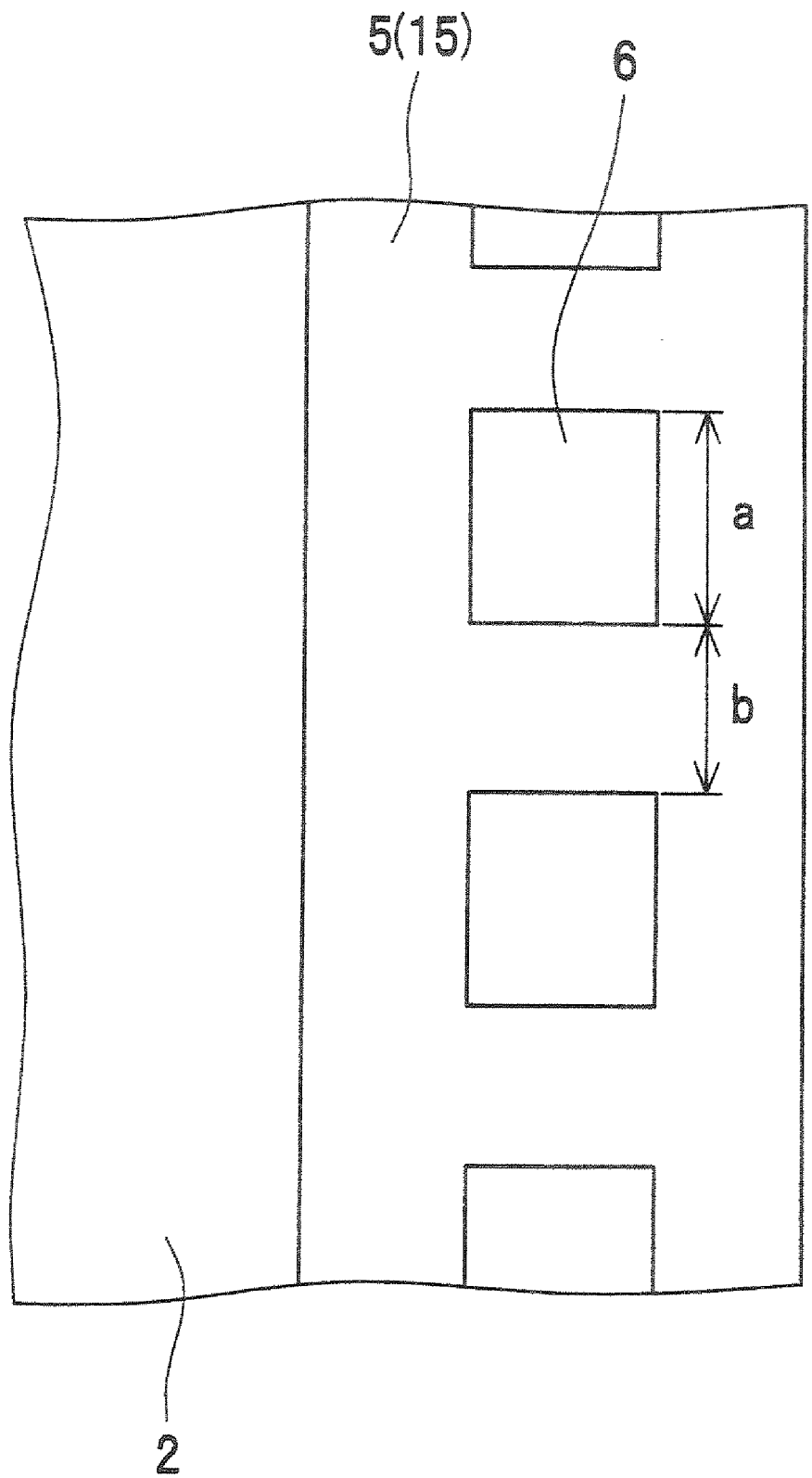
FIG. 9 is a partial top view of another IGBT according to the Embodiment 1 of the present invention.

FIG. 8 is a partial top view of the IGBT 100, while FIG. 9 is a partial top view of the IGBT 150. The same reference numerals as those appearing in FIGS. 1 and 5 denote the same or corresponding portions.

In FIGS. 8 and 9, the stripe-like n-type emitter layers 6 are disposed equidistant from each other along an edge portion of the n− layer 2. The width of the n-type emitter layers 6 along the direction of the edge portion of the n− layer 2 (the top-to-bottom direction in FIGS. 8 and 9) is denoted at a, whereas the gaps between the adjacent n-type emitter layers 6 are denoted at b.

In FIGS. 8 and 9, a>b holds true. When having a structure in which a>b is satisfied, the IGBTs 100 and 150 have a longer channel width (which is the length of the region located between the n− layer 2 and the emitter layers 6 taken along the direction of the edge portion of the n− layer 2), than when having a structure in which a<b is satisfied. This improves emitter-collector current (ICE) characteristics which the IGBTs 100 and 150 exhibit and suppresses operations of a parasitic npn bipolar transistor formed by the n− layer 2/the p-type base layer 5/the n-type emitter layers 6. In addition, this prevents latching up of a parasitic thyristor formed by the p-type collector layer 4/the n-type buffer layer 3/the n− layer 2/the p-type base layer 5/the n-type emitter layers 6.

When the p-type base layer 5 is shaped like a ring as in the IGBTs 100 and 150, the channel width is wider and the emitter-collector current (ICE) characteristic is accordingly better as compared with where the p-type base layer 5 is shaped as an oval as in the IGBTs 1000 which have a conventional structure. Although the foregoing has described that the unit IGBTs have circular shapes, the unit IGBTs may have oval shapes which are close to circles or polygonal shapes which are close to circles (This similarly applies also to the embodiments described below.).

Figure 10:
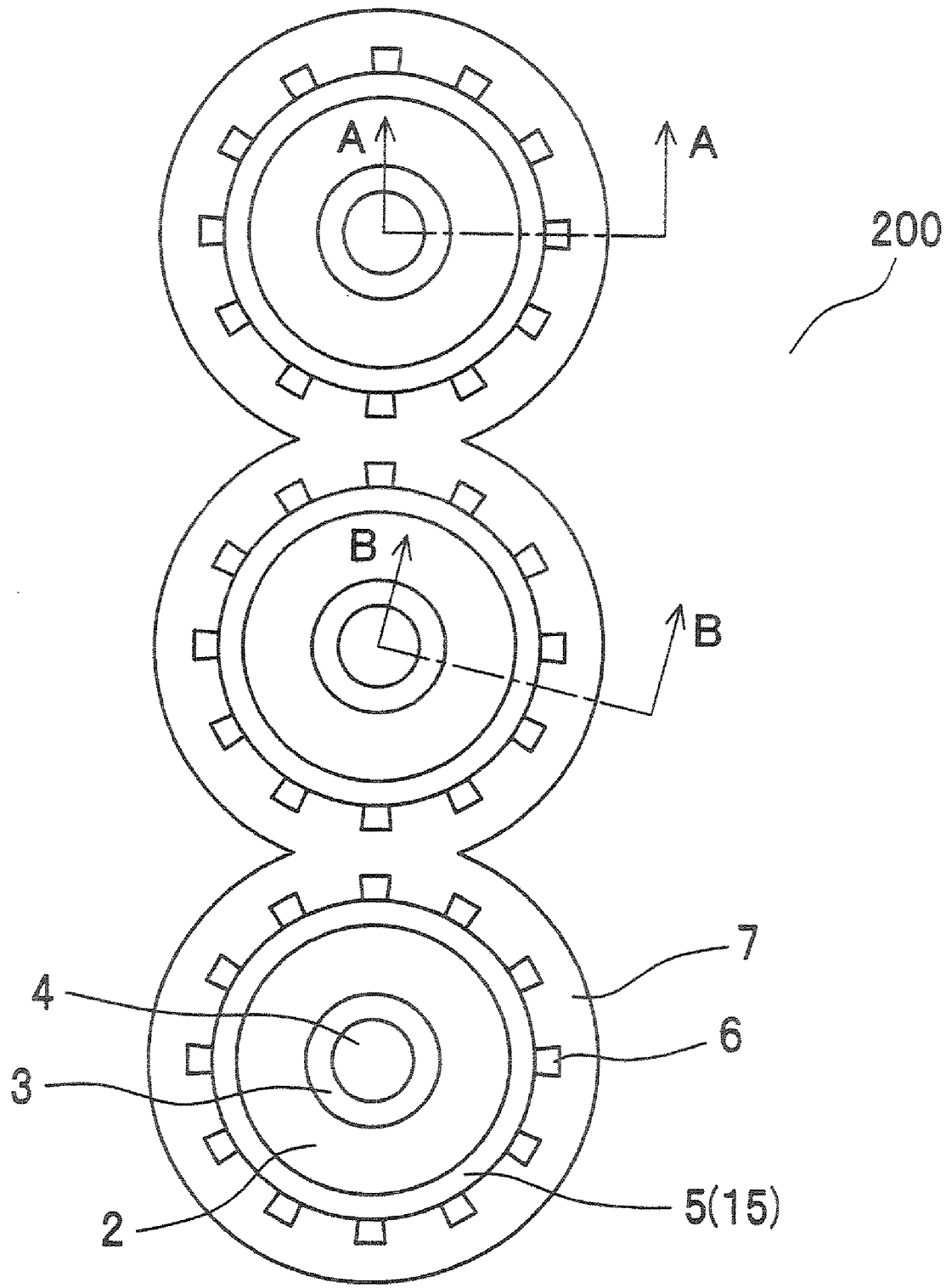
FIG. 10 is a top view of other IGBT according to the Embodiment 1 of the present invention.

FIG. 10 is a top view of other IGBT according to the Embodiment 1 of the present invention generally denoted at 200. This is the same structure as that of the IGBT 100 except for that the p-type emitter layers 7 of circle-like adjacent unit IGBTs partially overlap each other. A cross sectional view taken along the direction A-A and that along the direction B-B as well are the same respectively as the cross sectional views in FIGS. 2 and 3.

Figure 11:
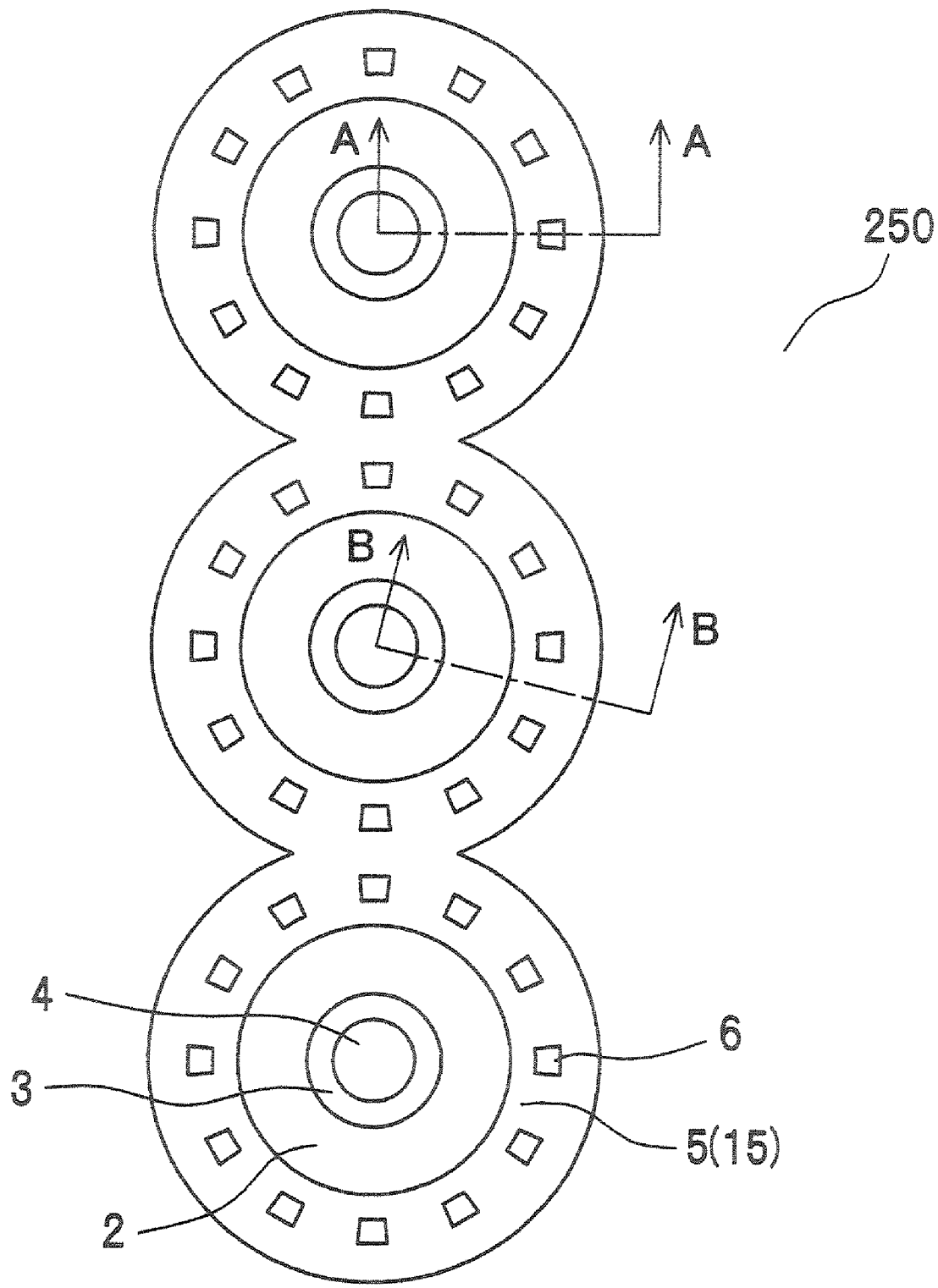
FIG. 11 is a top view of still other IGBT according to the Embodiment 1 of the present invention.

FIG. 11 is a top view of still other IGBT according to the Embodiment 1 of the present invention generally denoted at 250. The IGBT 250 has the same structure as that of the IGBT 200, except for that the IGBT 250 does not have the p-type emitter layer 7, and the p-type base layers 5 of circle-like adjacent unit IGBTs partially overlap each other. A cross sectional view taken along the direction A-A and that along the direction B-B as well are the same respectively as the cross sectional views in FIGS. 6 and 7.

As described above, like the IGBTs 100 and 150, the IGBTs 200 and 250 as well improve their emitter-collector current (ICE) characteristics, suppress operations of a parasitic npn bipolar transistor and prevent latching up of a parasitic thyristor formed by the p-type collector layer 4/the n-type buffer layer 3/the n− layer 2/the p-type base layer 5/the n-type emitter layers 6.

Figure 12:
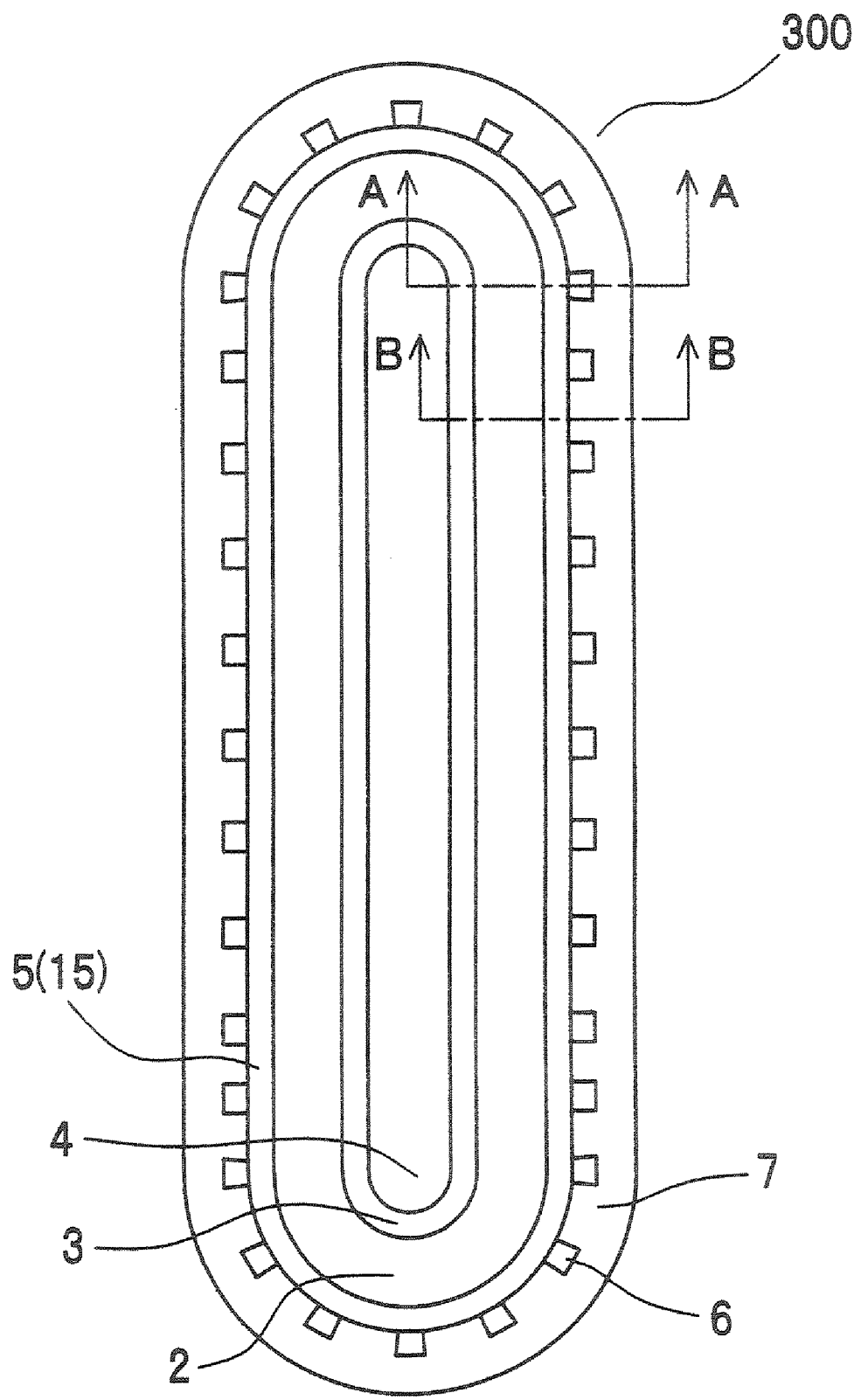
FIG. 12 is a top view of other different IGBT according to the Embodiment 1 of the present invention.
Figure 30:
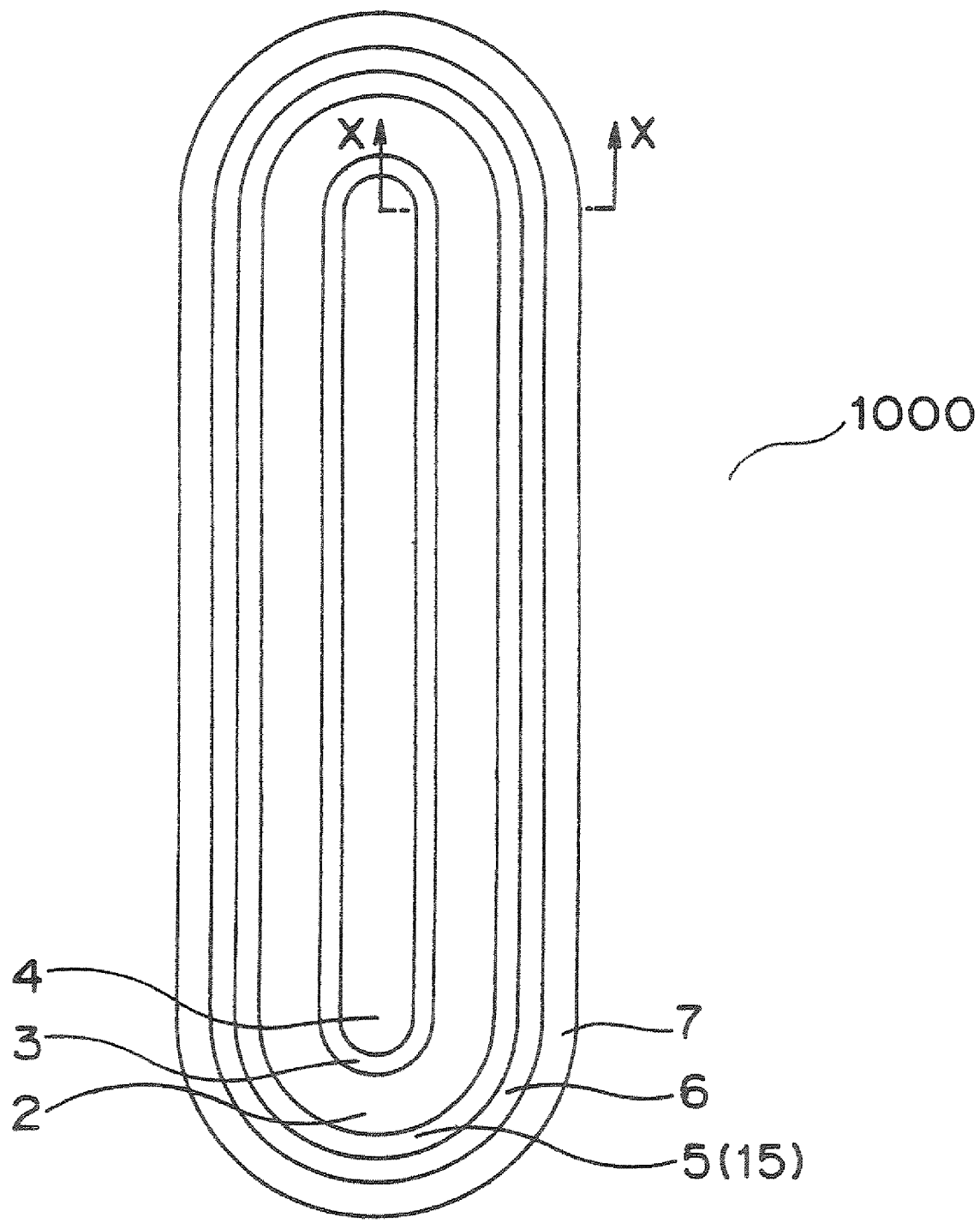
FIG. 30 is a top view of a conventional IGBT.
Figure 31:
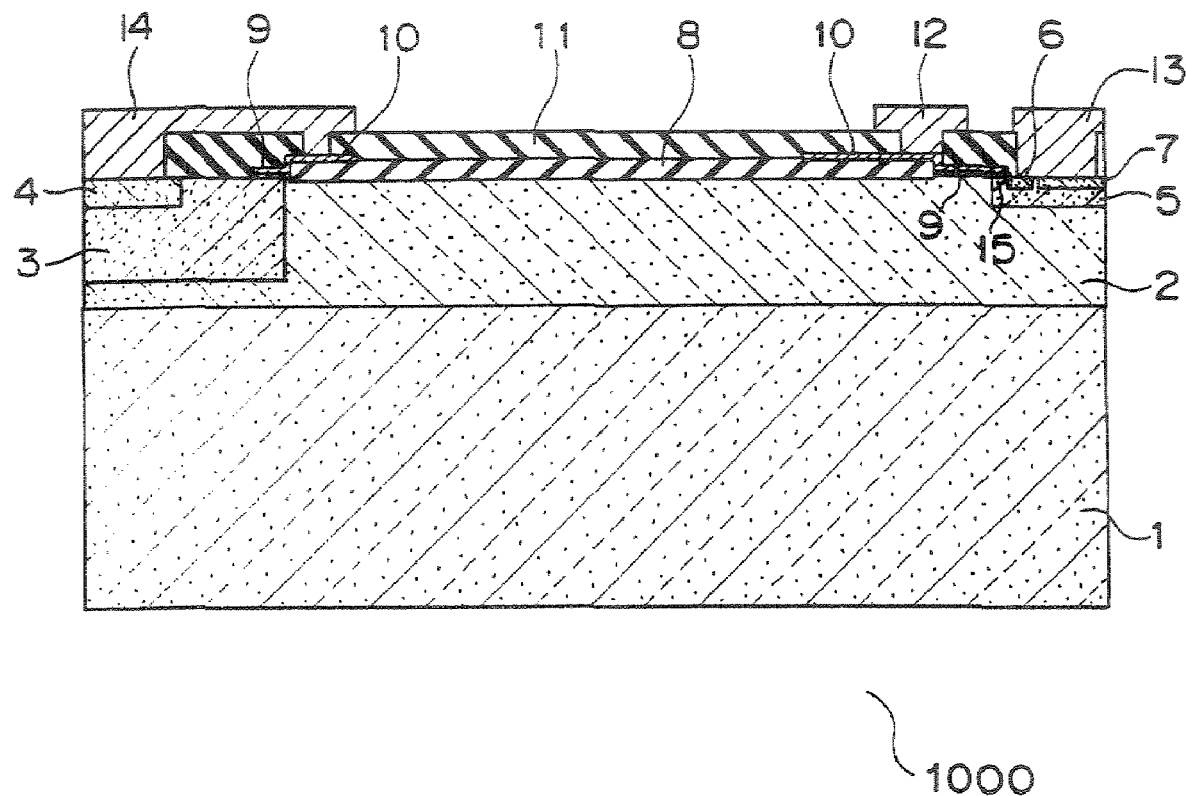
FIG. 31 is a cross sectional view of the conventional IGBT.
Figure 32:
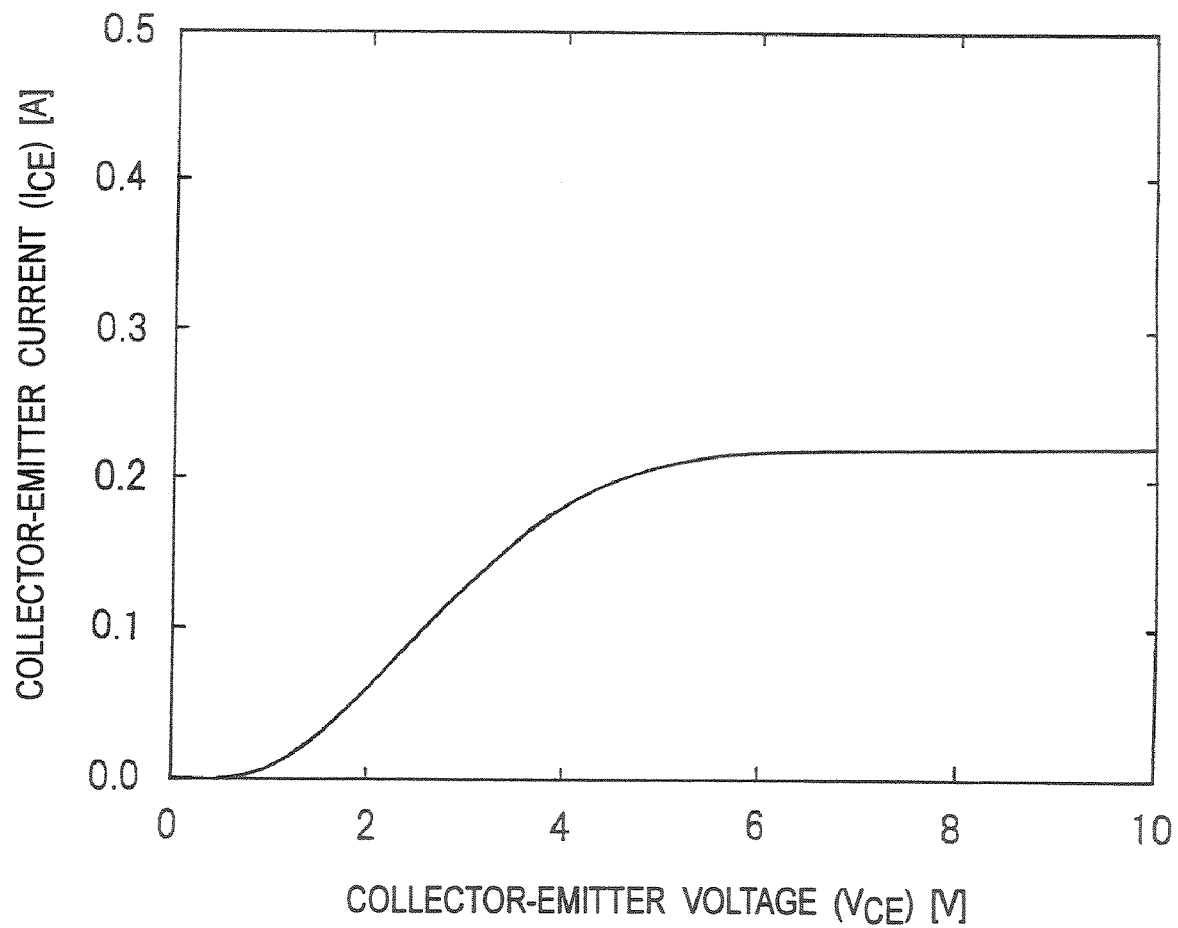
FIG. 32 shows a relationship between a collector-emitter voltage (VCE) and a collector-emitter current (ICE) in the conventional IGBT.
Figure 33:
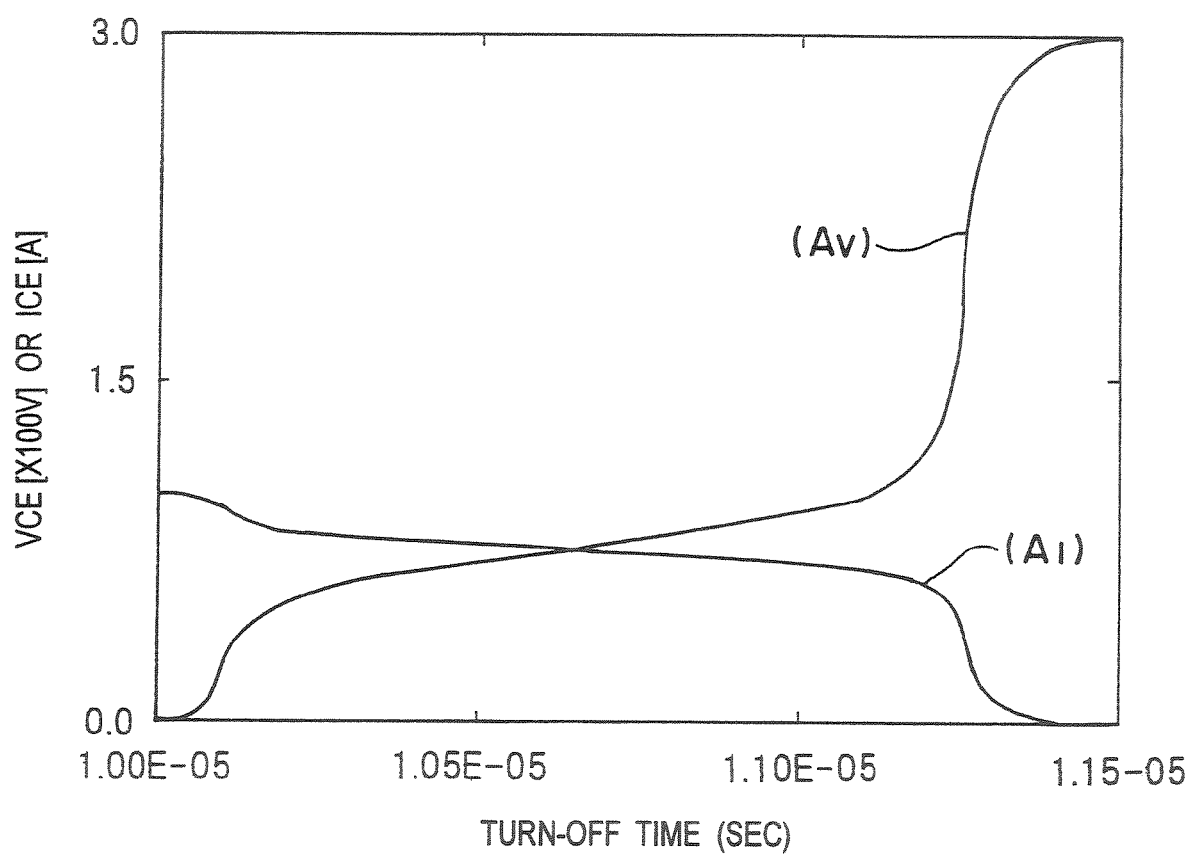
FIG. 33 shows the turn-off waveform of the conventional IGBT.

Further, FIG. 12 is a top view of a different other IGBT according to the Embodiment 1 of the present invention generally denoted at 300. In the IGBT 300, the n-type emitter layers 6 (unit emitter layers) are shaped like stripes and discontinuously surround the channel region 15, unlike in the IGBTs 1000 having the conventional structure which is shown in FIG. 30. The emitter layers 6 may for example be shaped like trapezoids, fans, etc.

A cross sectional view of the IGBT 300 taken along the direction A-A and that along the direction B-B as well are the same respectively as the cross sectional views in FIGS. 2 and 3.

Figure 13:
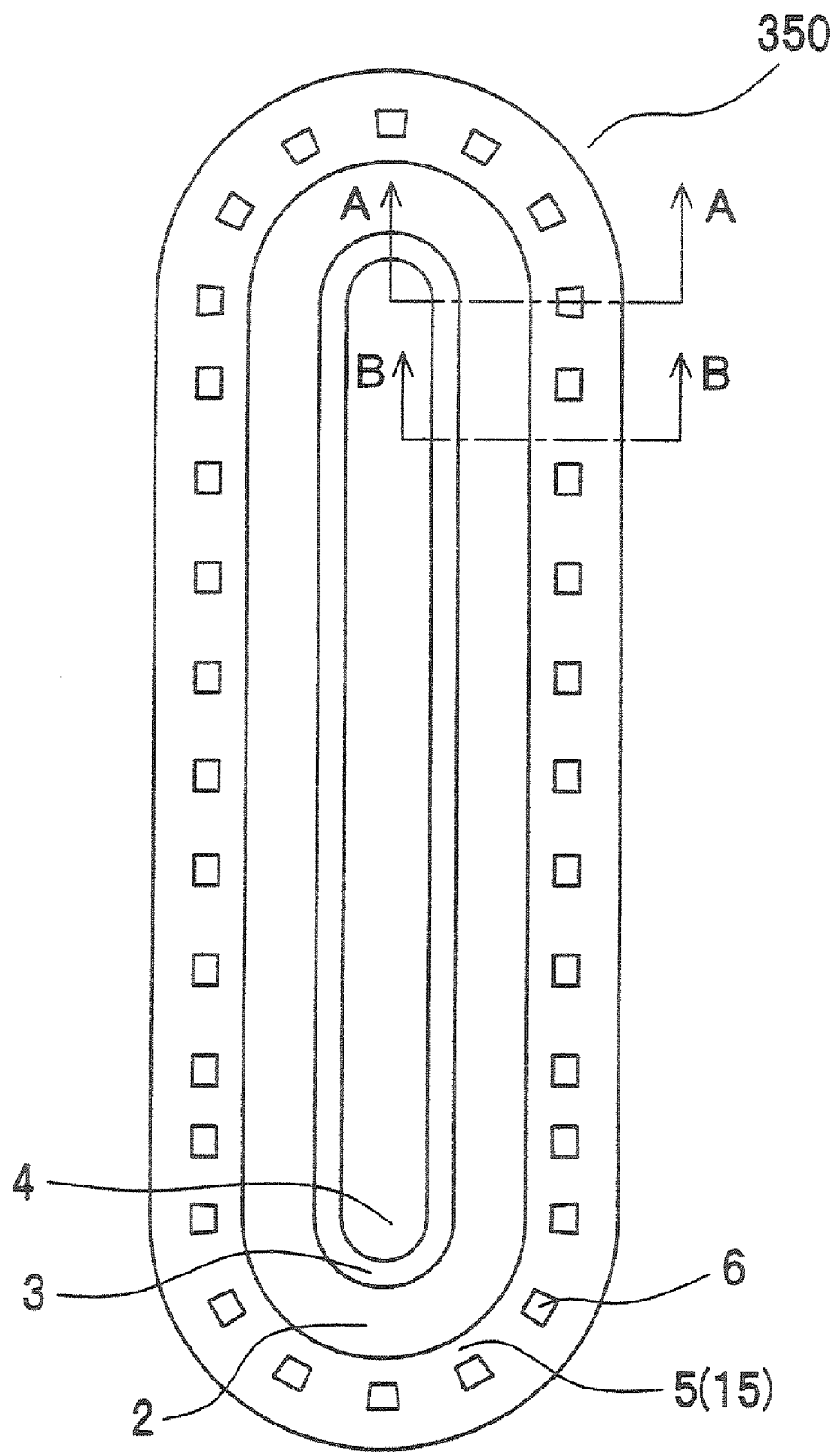
FIG. 13 is a top view of a further different IGBT according to the Embodiment 1 of the present invention.

FIG. 13 is a top view of a further different IGBT according to the Embodiment 1 of the present invention generally denoted at 350. The IGBT 350 has the same structure as that of the IGBT 300, except for that the IGBT 350 does not include the p-type emitter layer 7. A cross sectional view of the IGBT 350 taken along the direction A-A and that along the direction B-B as well are the same respectively as the cross sectional views in FIGS. 6 and 7.

As described above, when the structure related to the n-type emitter layers 6 according to the Embodiment 1 is applied even to the IGBT 1000 having the conventional structure, it is possible to improve the emitter-collector current (ICE) characteristic, suppress operations of a parasitic npn bipolar transistor and prevent latching up of a parasitic thyristor formed by the p-type collector layer 4/the n-type buffer layer 3/the n− layer 2/the p-type base layer 5/the n-type emitter layers 6.

Embodiment 2

Figure 14:
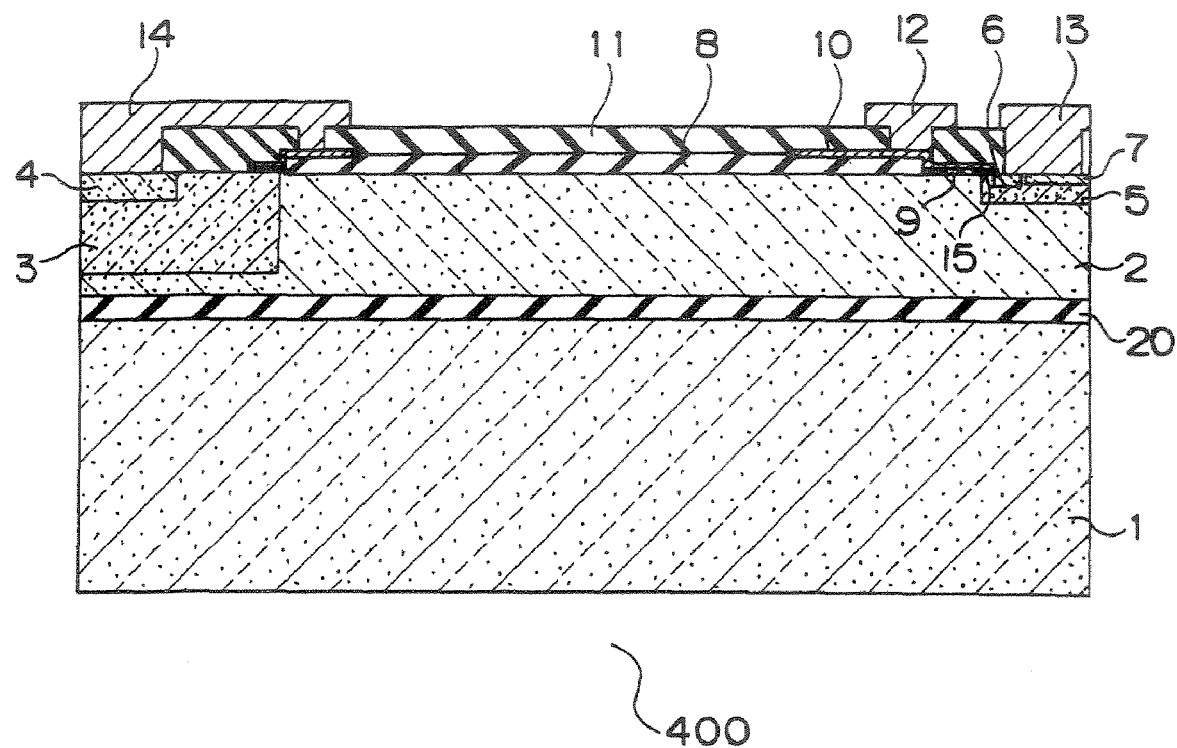
FIG. 14 is a cross sectional view of an IGBT according to an Embodiment 2 of the present invention.
Figure 15:
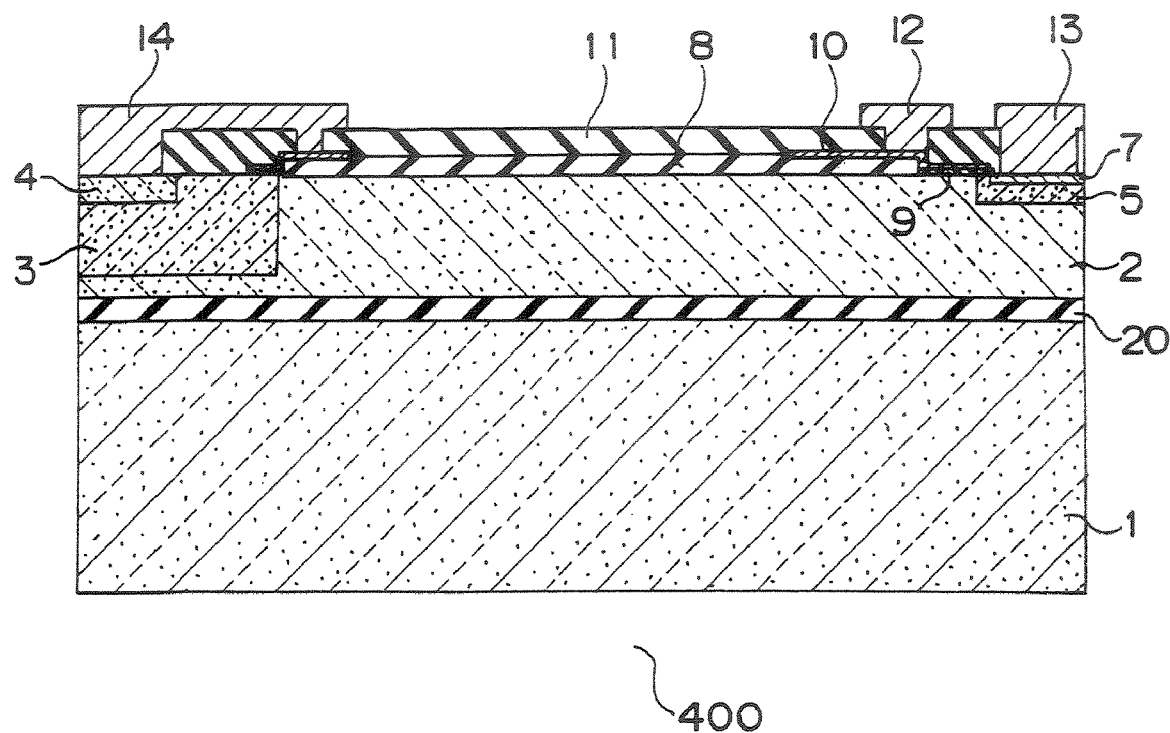
FIG. 15 is a cross sectional view of another IGBT according to the Embodiment 2 of the present invention.

FIGS. 14 and 15 are cross sectional views of an IGBT according to the Embodiment 2 of the present invention generally denoted at 400, which respectively correspond to a cross sectional view taken along the direction A-A shown in FIG. 1 and a cross sectional view taken along the direction B-B shown in FIG. 1.

The IGBT 400 has an SOI structure (of the dielectric-isolated horizontal type) in which a buried oxide film 20 which may be a silicon oxide film for example is formed between the p-type substrate 1 and the n− layer 2. The structure is otherwise the same as that of the IGBT 100 (which is of the junction-isolated horizontal type) (See FIGS. 2 and 3.).

Figure 16:
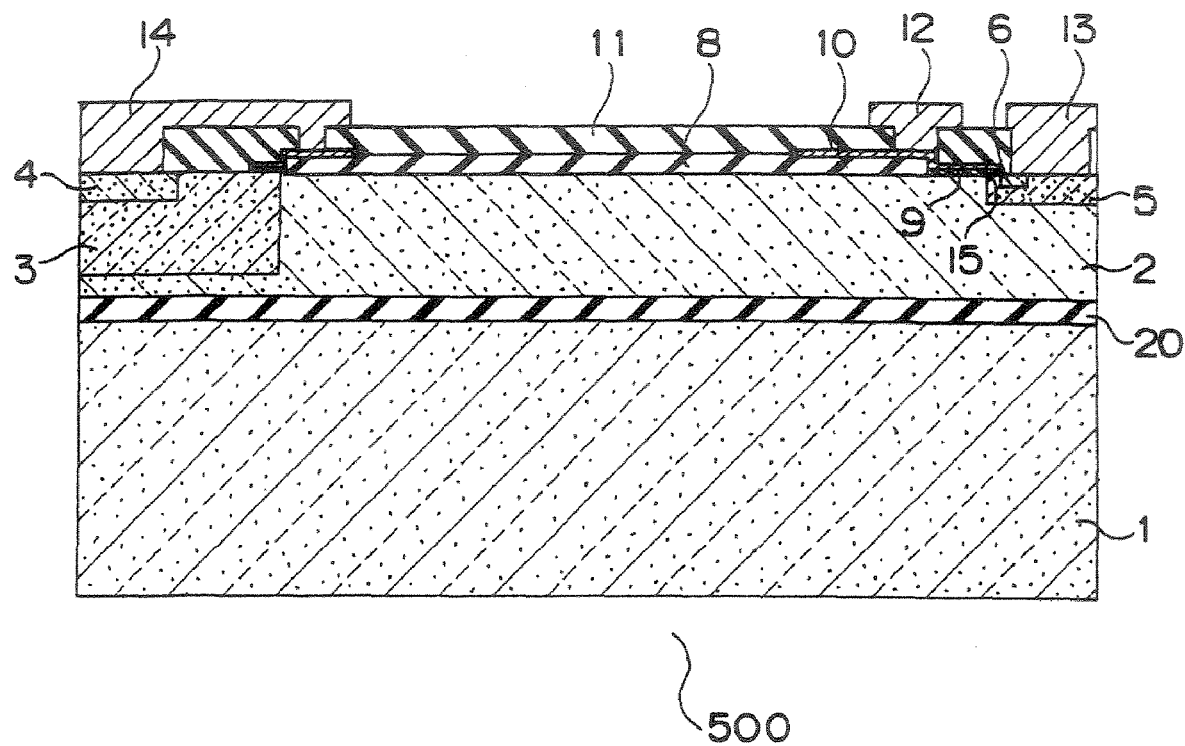
FIG. 16 is a cross sectional view of other IGBT according to the Embodiment 2 of the present invention.
Figure 17:
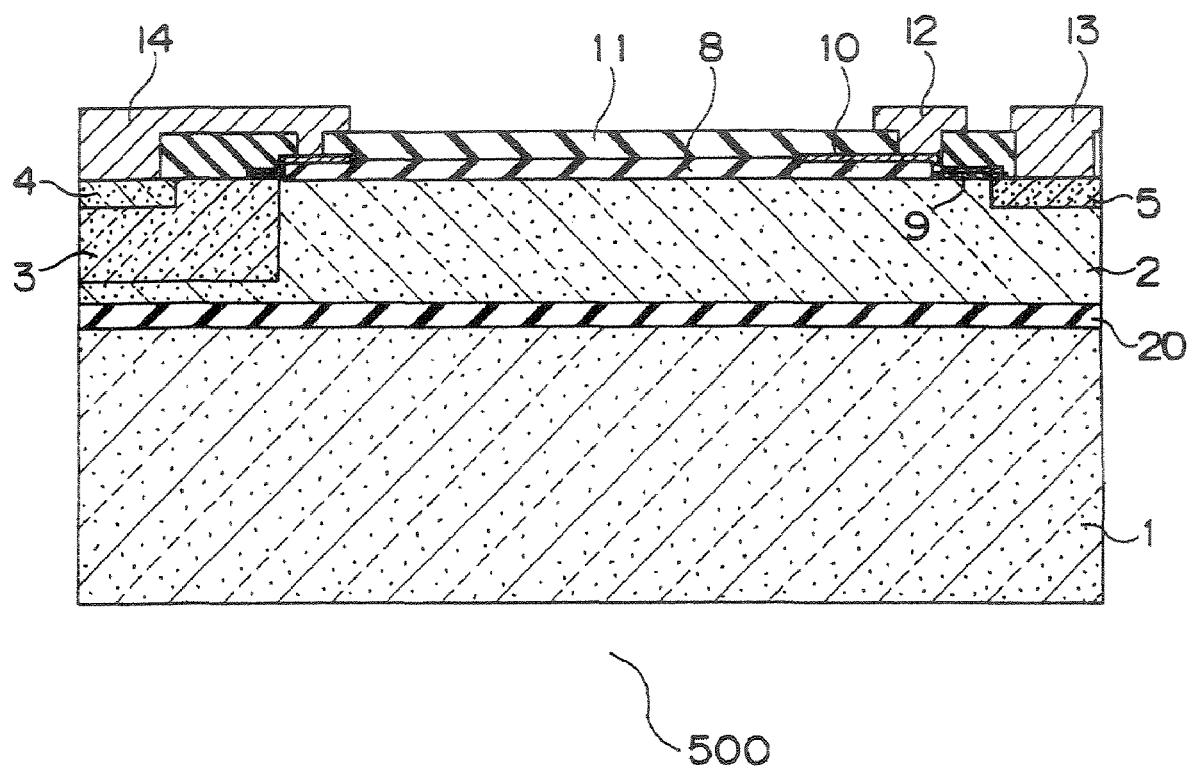
FIG. 17 is a cross sectional view of the other IGBT according to the Embodiment 2 of the present invention.

FIGS. 16 and 17 are cross sectional views of other IGBTs according to the Embodiment 2 of the present invention generally denoted at 500, which respectively correspond to a cross sectional view taken along the direction A-A shown in FIG. 5 and a cross sectional view taken along the direction B-B shown in FIG. 5.

The IGBT 500 has an SOI structure in which the buried oxide film 20 which may be a silicon oxide film for example is formed between the p-type substrate 1 and the n− layer 2. The structure is otherwise the same as that of the IGBT 150 (See FIGS. 6 and 7.). In other words, except for omission of the p-type emitter layer 7, the IGBT 500 has the same structure as that of the IGBT 400.

This structure promises similar effects to those which the IGBTs 100 and 150 described above achieve, and also permits choosing the conductivity type of the substrate 1 irrespective of the conductivity type of the n− layer 2.

Such an SOI structure including the buried oxide film 20 is applicable also to the IGBTs 200 and 250 (FIGS. 10 and 11) and the IGBTs 300 and 350 (FIGS. 12 and 13).

Embodiment 3

Figure 18:
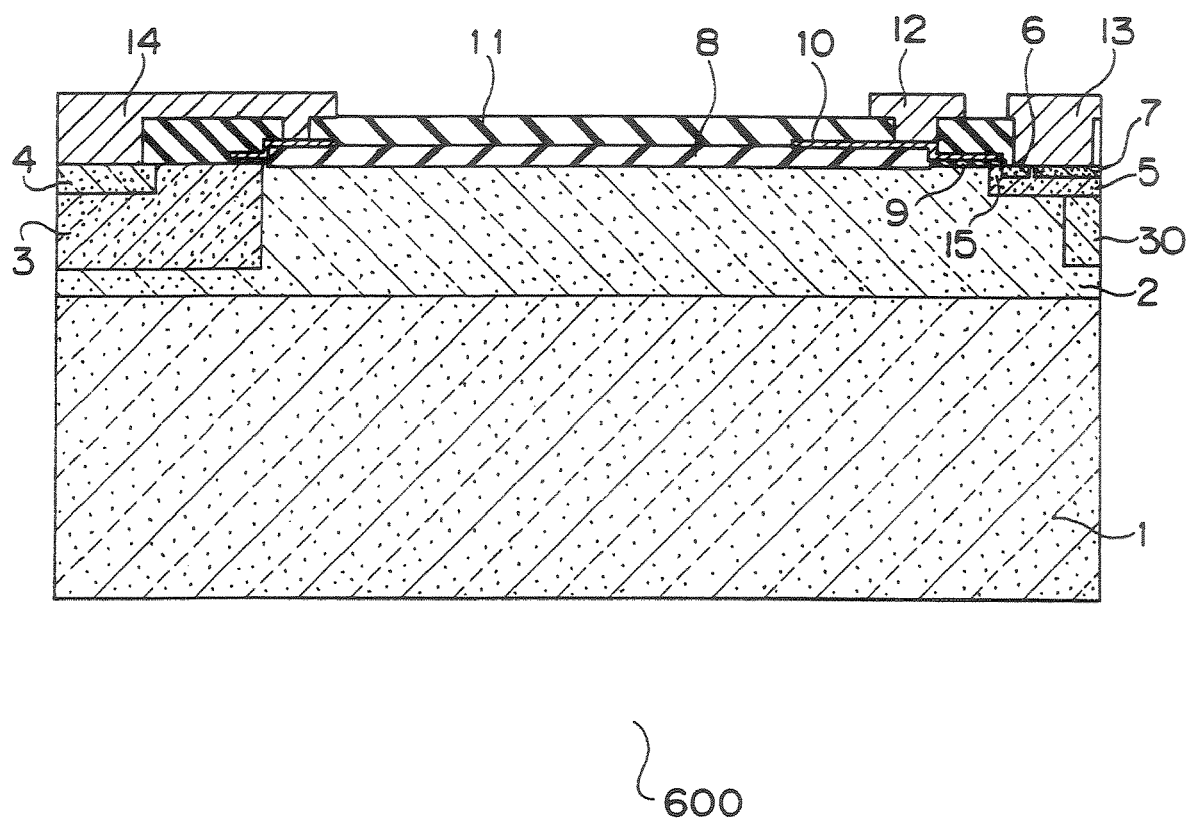
FIG. 18 is a cross sectional view of an IGBT according to an Embodiment 3 of the present invention.

FIG. 18 is a cross sectional view of an IGBT according to the Embodiment 3 of the present invention generally denoted at 600, taken along the direction A-A shown in FIG. 1. In FIG. 18, the same reference numerals as those appearing in FIG. 2 denote the same or corresponding portions.

The IGBT shown in FIG. 18 includes, on the emitter side, a p− layer 30 which is formed narrower and deeper than the p-type base layer 5 but not deep enough to reach the p-type substrate 1 in such a manner that it contacts the bottom surface of the p-type base layer 5. The structure is otherwise the same as that of the IGBT 100 which is shown in FIG. 2.

Figure 19:
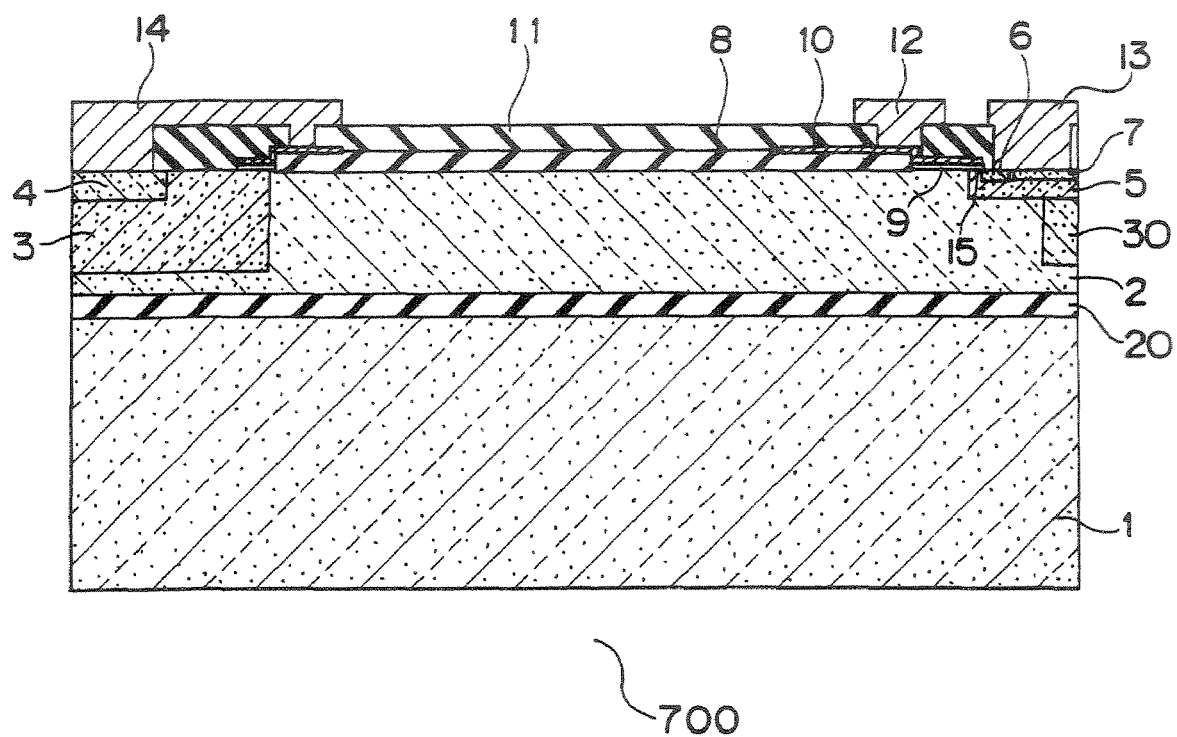
FIG. 19 is a cross sectional view of another IGBT according to the Embodiment 3 of the present invention.

FIG. 19 is a cross sectional view of another IGBT according to the Embodiment 3 of the present invention generally denoted at 600, also taken along the direction A-A shown in FIG. 1. The IGBT 700 has an SOI structure (of the dielectric-isolated horizontal type) which is the same as the structure of the IGBT 600 as it is modified to include the buried oxide film 20, such as a silicon oxide film, which is formed between the p-type substrate 1 and the n− layer 2.

The p-type region formed in contact with the bottom surface of the p-type base layer 5 may either be p−, p or p+, and the bottom section of the p-type region, which contacts the bottom surface of the p-type base layer 5, develops a progressively stronger electric field when formed as p+ (high electric field), p and p− (low electric field) in this order. A hole current therefore more easily flow when this region is p+ (high electric field): In the event that the bottom section of the p-type region formed in contact with the bottom surface of the p-type base layer is p+ (high electric field), it is possible to better prevent latching up of a parasitic thyristor and shorten the fall time (tf) (which is the time needed for ICE of the IGBT to come down to 10% from 90% of the maximum value).

As described above, the IGBTs 600 and 700 according to the Embodiment 3 prevent latching up of a parasitic thyristor, shorten the fall time (tf), and further, increase the switching speed.

Embodiment 4

Figure 20:
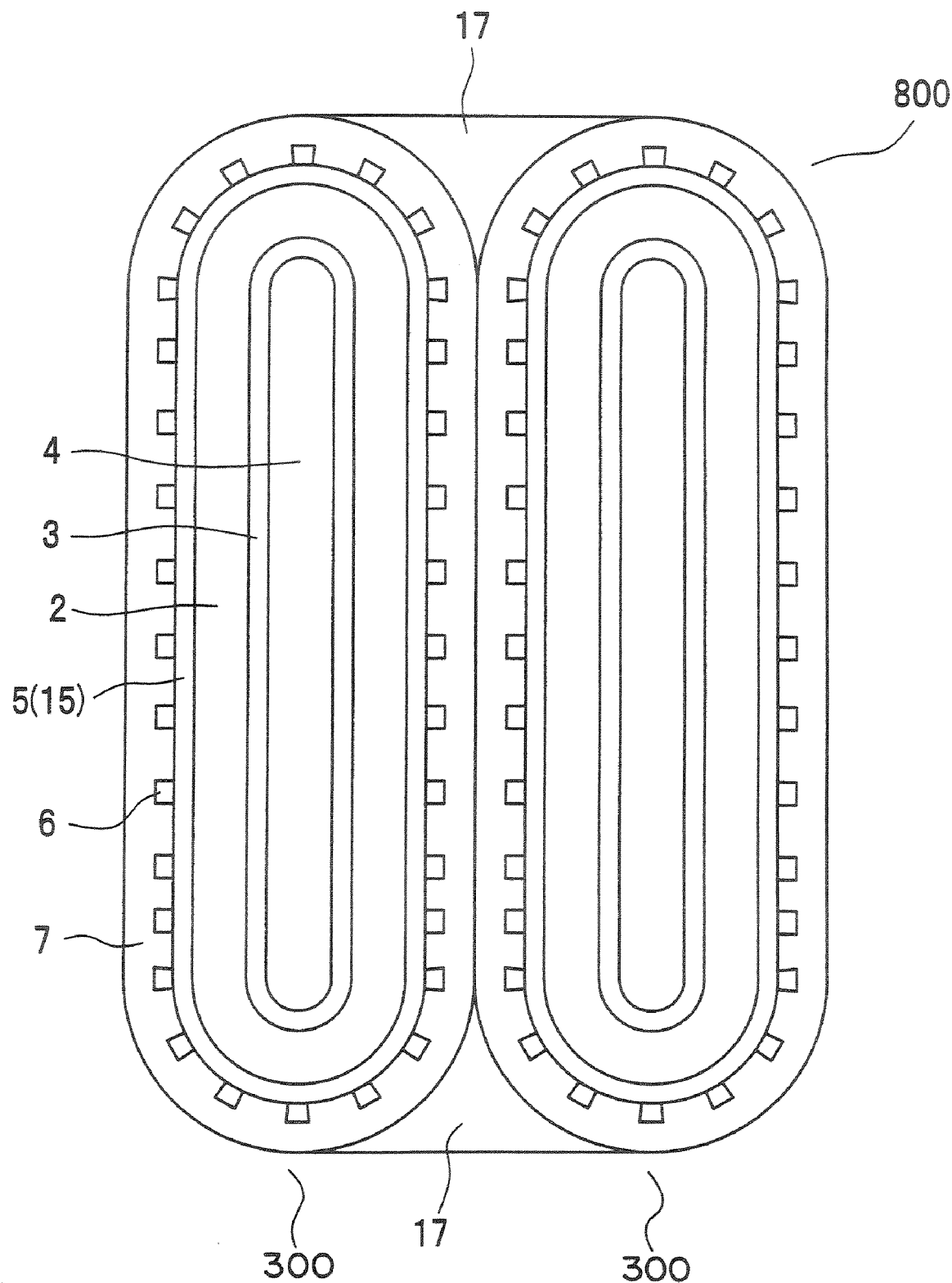
FIG. 20 is a top view of an IGBT according to an Embodiment 4 of the present invention.

FIG. 20 is a top view of an IGBT generally denoted at 800 which is a combination of two IGBTs 300 according to the Embodiment 1. In the IGBT 800, p-type emitter layers 17 are formed in areas between a common contact line (i.e., the contact line on the outer circumferences of the p-type emitter layers 7) and the two adjacent IGBTs, which expands the area sizes of the contact between the p-type emitter layers 7 and 17 and the emitter electrode.

In this structure, the p-type emitter layers 7 and 17 are wider than the n-type emitter layers 6. This reduces the contact resistance between the p-type emitter layers 7 and 17 and the emitter electrode and ensures a smooth flow of holes to the emitter contact region without becoming stagnant immediately below the n-type emitter layers 6. This is because of a lowered base resistance of the p-type base layer 5 which is right below the n-type emitter layers 6.

This suppresses operations of a parasitic npn bipolar transistor formed by the n− layer 2/the p-type base layer 5/the n-type emitter layers 6 and prevents latching up of a parasitic thyristor formed by the p-type collector layer 4/the n-type buffer layer 3/the n− layer 2/the p-type base layer 5/the n-type emitter layers 6. As a result, at the time of turning off or during the steady ON-state, the latch-up tolerance of a parasitic thyristor improves in the IGBT 800.

Figure 21:
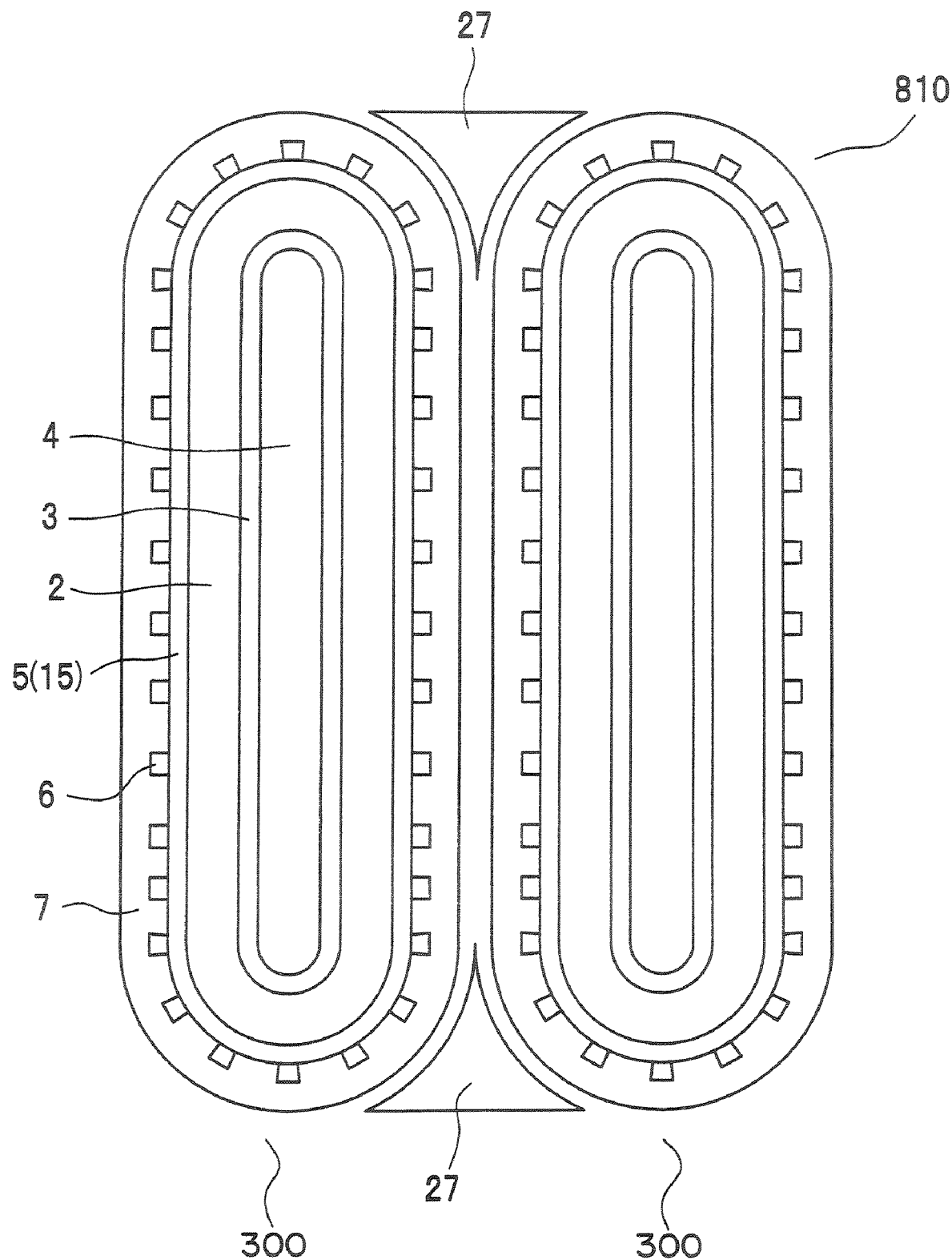
FIG. 21 is a top view of another IGBT according to the Embodiment 4 of the present invention.

FIG. 21 is a top view of another IGBT according to the Embodiment 4 generally denoted at 810. In the IGBT 810, fan-shaped p-type emitter layers 27 are formed off the p-type emitter layer 7, within areas between the common contact line to the two adjacent IGBTs 300 and the two IGBTs.

Figure 22:
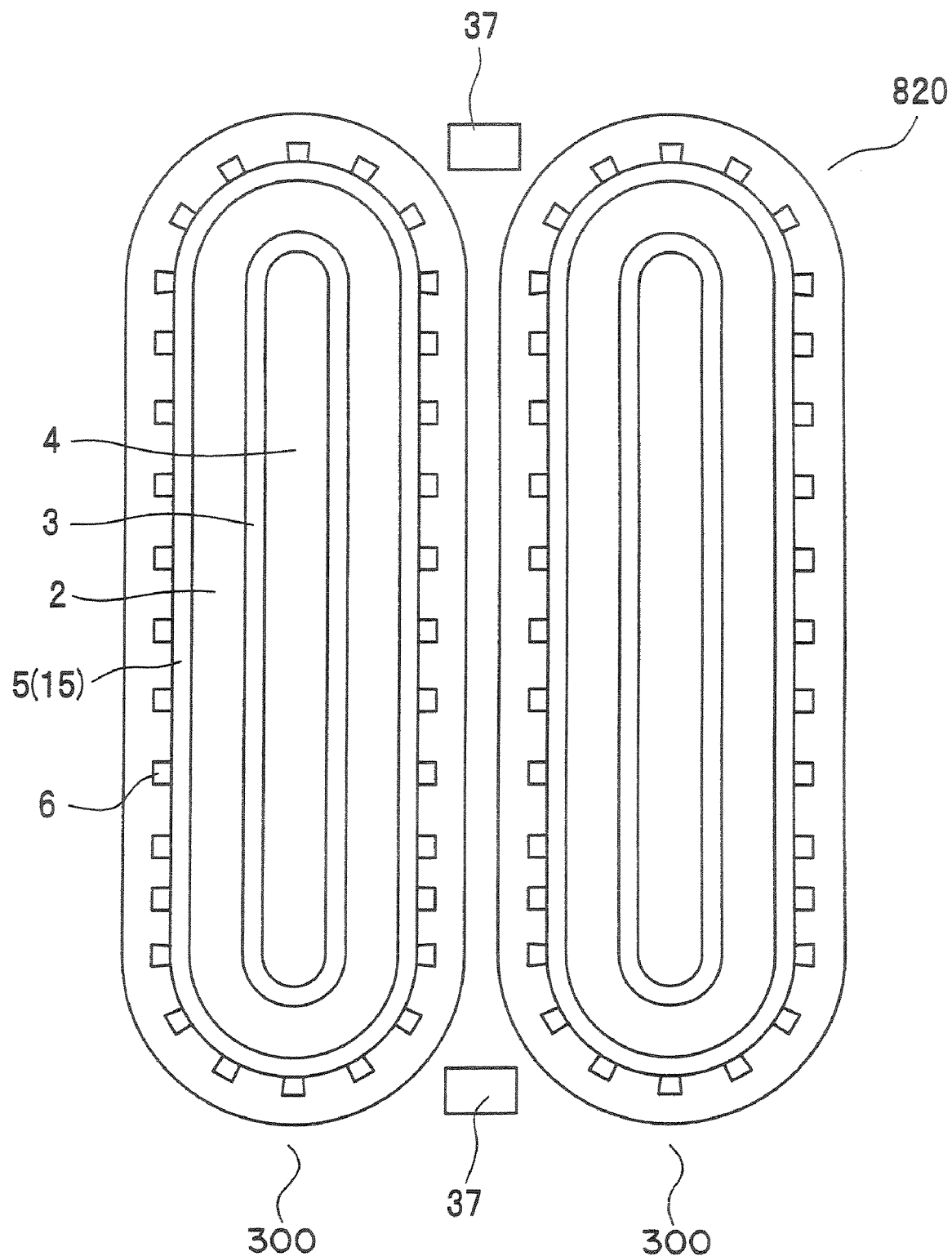
FIG. 22 is a top view of other IGBT according to the Embodiment 4 of the present invention.

FIG. 22 is a top view of other IGBT according to the Embodiment 4 generally denoted at 820. In the IGBT 820, rectangular p-type emitter layers 37 are formed off the p-type emitter layer 7, within areas between the common contact line to the two adjacent IGBTs 300 and the two IGBTs.

Like the IGBT 800, the IGBTs 810 and 820 as well improve the latch-up tolerance of a parasitic thyristor at the time of turning off or during the steady ON-state.

Figure 23:
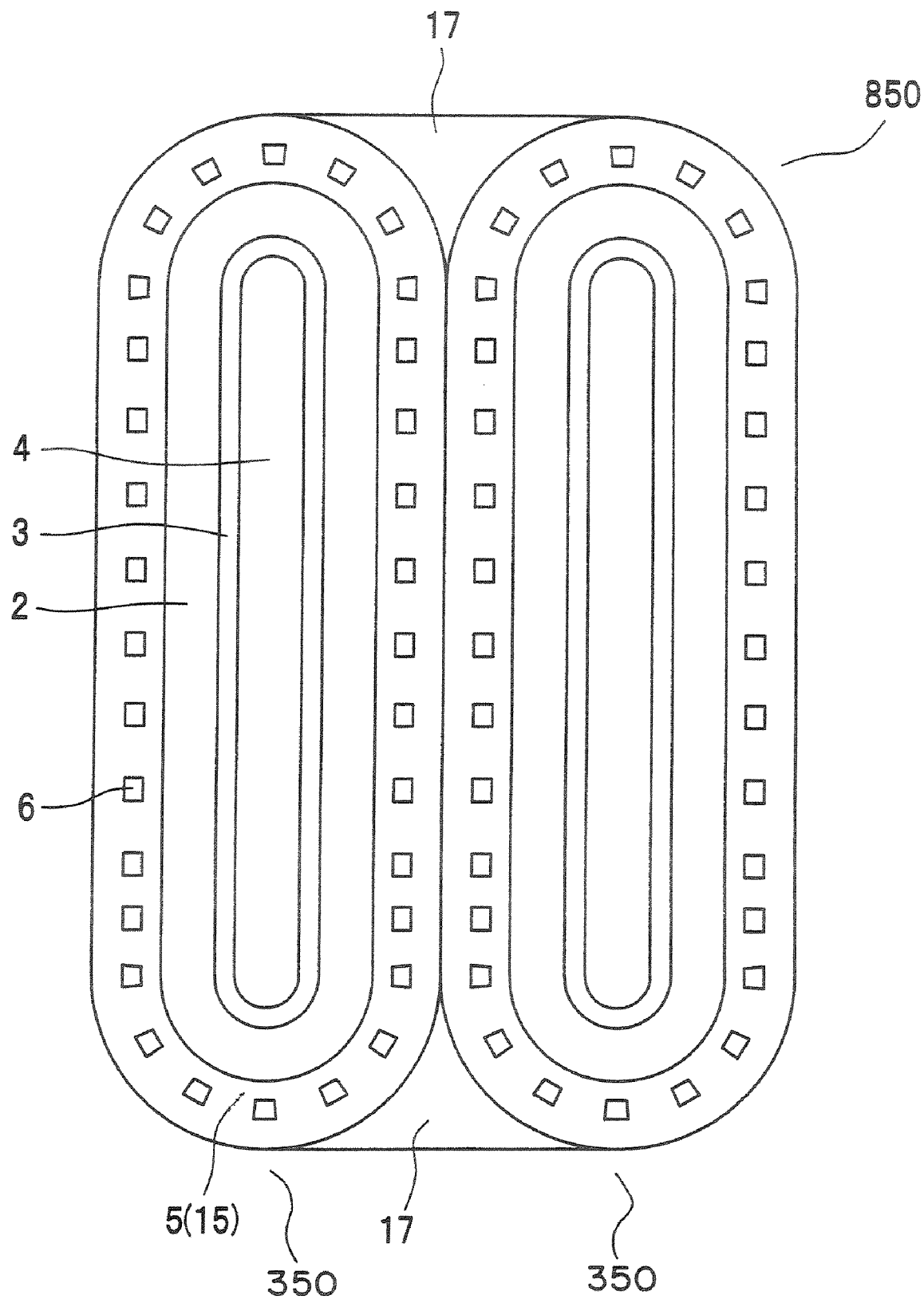
FIG. 23 is a top view of yet another IGBT according to the Embodiment 4 of the present invention.
Figure 24:
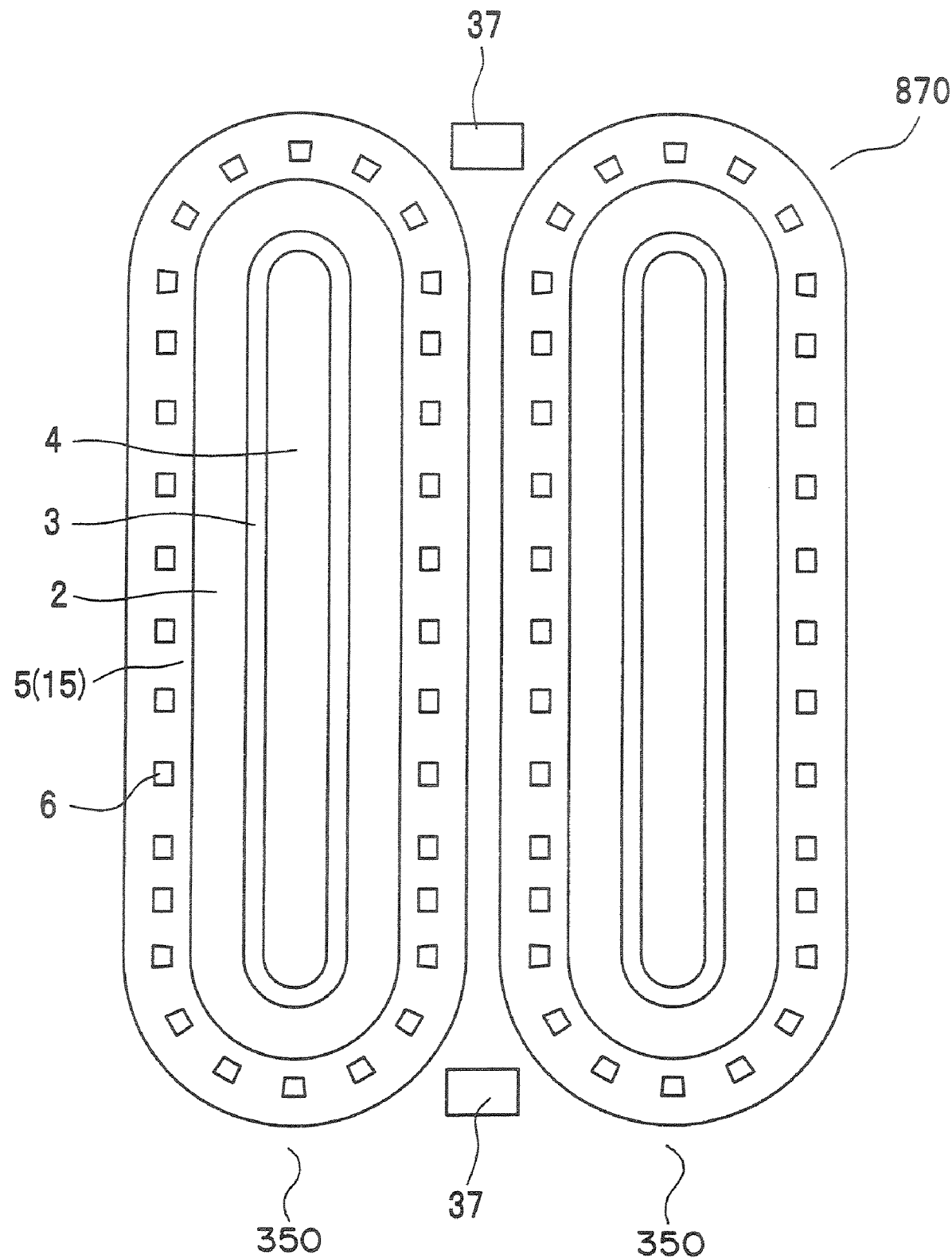
FIG. 24 is a top view of a different IGBT according to the Embodiment 4 of the present invention.
Figure 25:
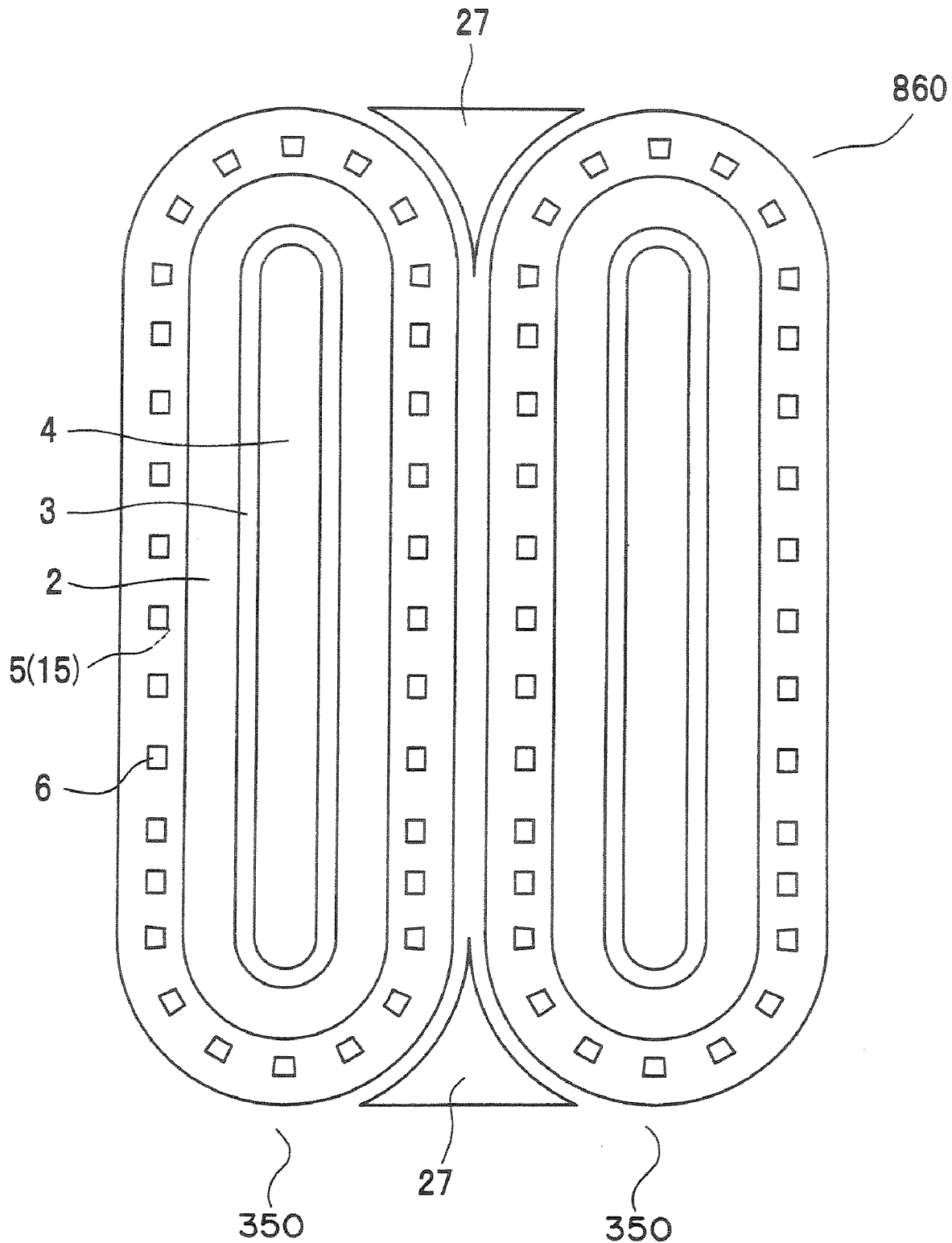
FIG. 25 is a top view of a further different IGBT according to the Embodiment 4 of the present invention.

FIGS. 23, 24 and 25 are top views of different IGBTs 850, 860 and 870 according to the Embodiment 4. These are obtained by applying the structures of the IGBTs 800, 810 and 820 to the IGBT 350 which does not include the p-type emitter layer 7.

Figure 26:
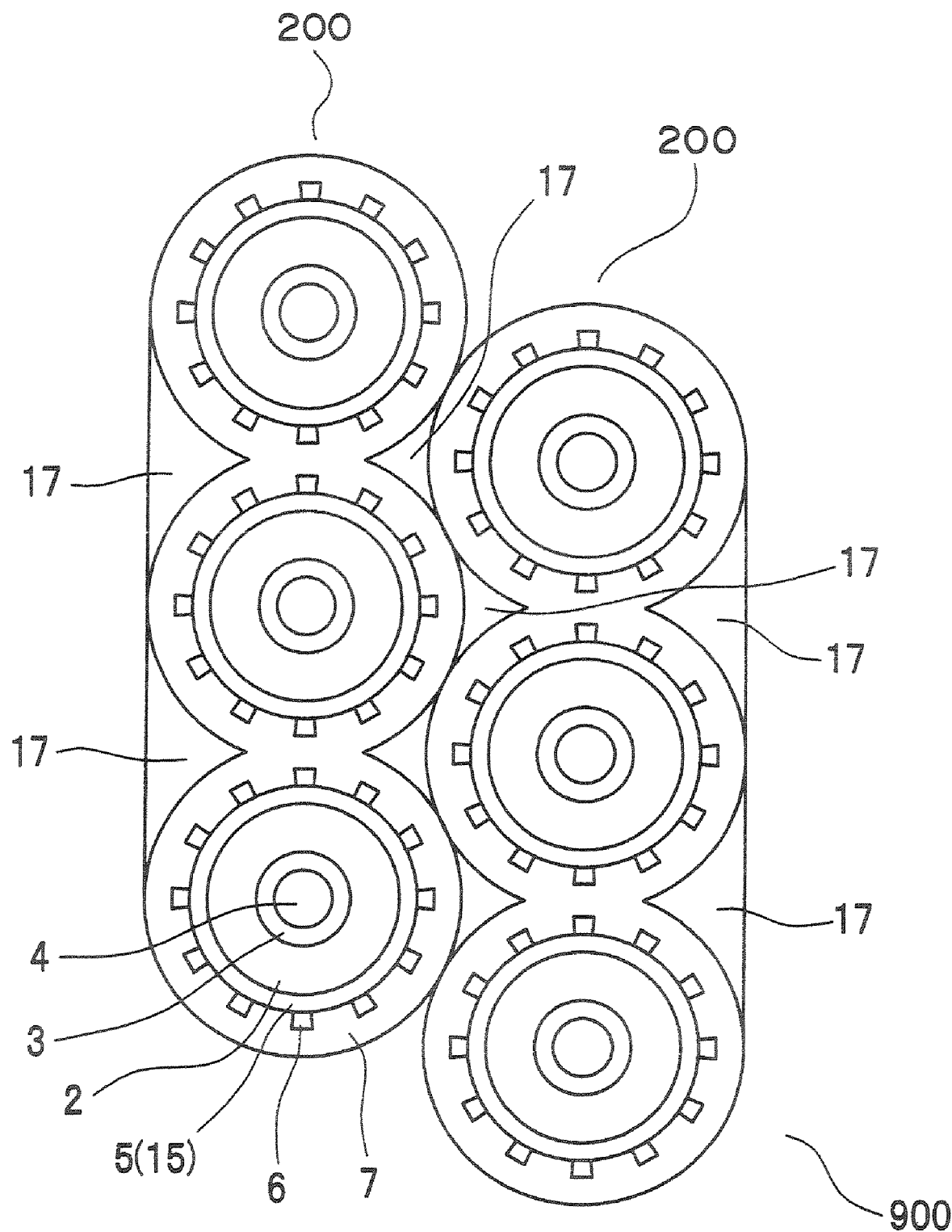
FIG. 26 is a top view of a still different IGBT according to the Embodiment 4 of the present invention.
Figure 27:
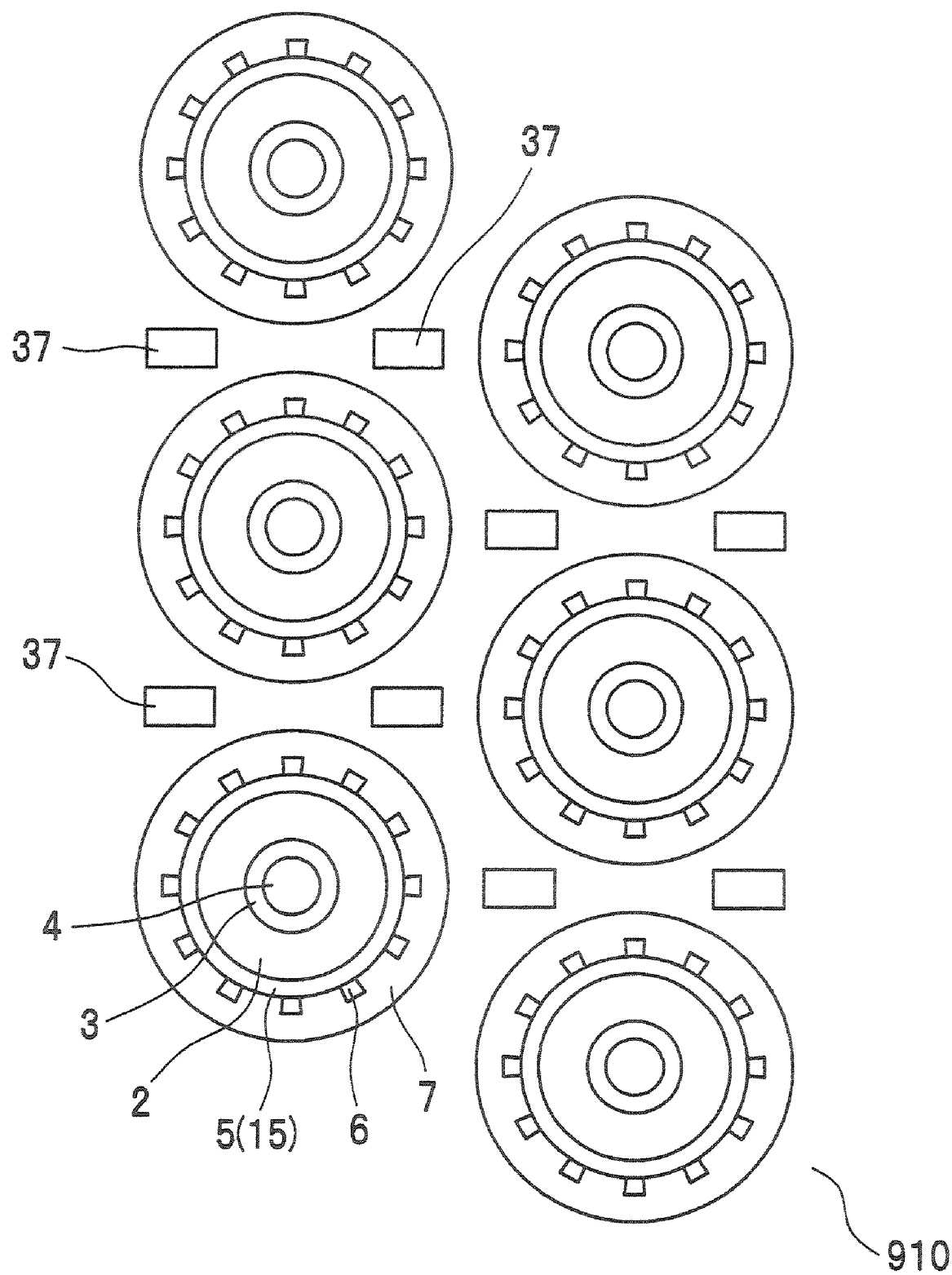
FIG. 27 is a top view of other different IGBT according to the Embodiment 4 of the present invention.

FIGS. 26 and 27 are top views of still different IGBTs 900 and 910 according to the Embodiment 4. In the IGBTs 900 and 910, p-type emitter layers 17 and 37 are formed within areas between the common contact line to the two adjacent unit IGBTs and the two IGBTs and also within areas between neighboring three unit IGBTs (which may either contact each other or remain separated from each other by certain distances), which expands the area sizes of the contact between the p-type emitter layers and the emitter electrode (i.e., the sizes of the emitter contact regions).

The p-type emitter layers 7 of the three unit IGBTs lined up along the vertical direction partially overlap each other in the IGBT 900, whereas the unit IGBTs are separated from each other in the IGBT 910.

Figure 28:
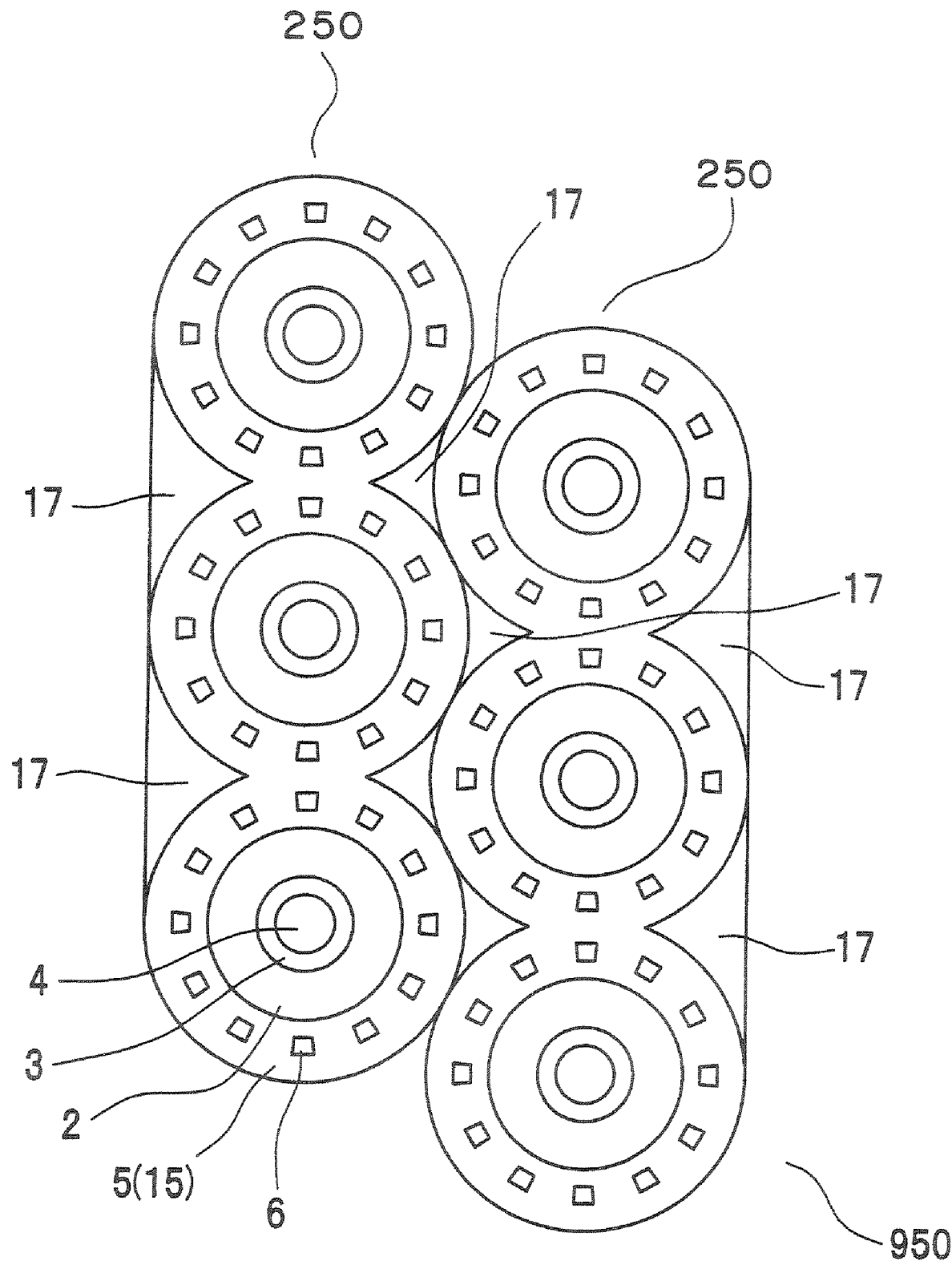
FIG. 28 is a top view of another different IGBT according to the Embodiment 4 of the present invention.
Figure 29:
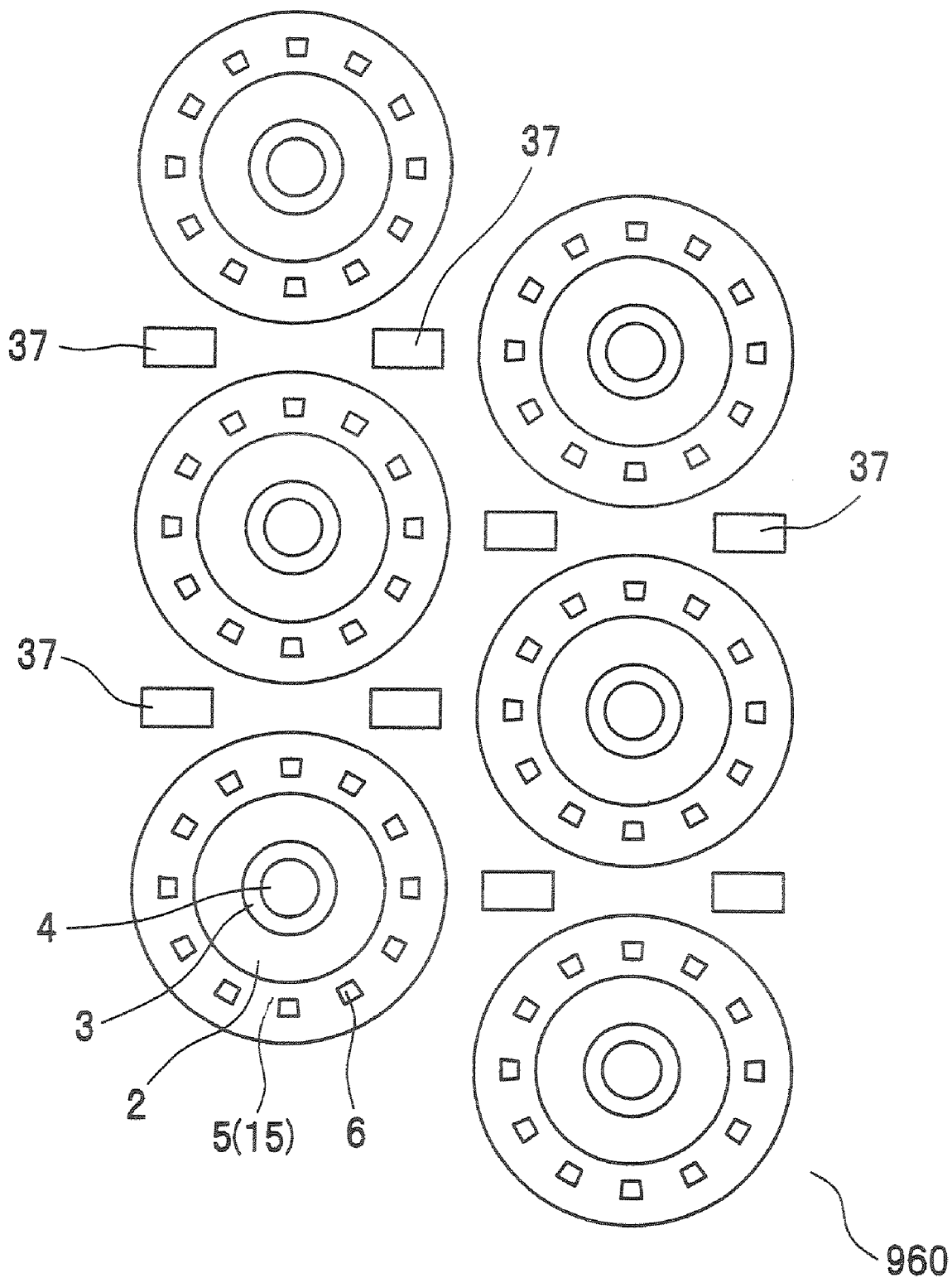
FIG. 29 is a top view of still another different IGBT according to the Embodiment 4 of the present invention.

FIGS. 28 and 29 are top views of further different IGBTs 950 and 960 according to the Embodiment 4. The IGBTs 950 and 960 are obtained by applying the structures of the IGBTs 900 and 910 to a structure in which a unit IGBT does not include the p-type emitter layer 7, and the p-type base layer 5 defines the outer circumference.

In such IGBTs 900, 910, 950 and 960 as well, the areas in which the p-type emitter layers 7, 17 and 37 (or the p-type base layers 5) contact the emitter electrode wires are large, which improves the latch-up tolerance of parasitic thyristors at the time of turning off or during the steady ON-state.

The p-type emitter layers 17, 27 and 37 described in relation to the Embodiment 4 are connected with the p-type base layer 5, the p-type emitter layer 7 and the like which are included in the IGBT, these p-type emitter layers may not be connected with them.

While the foregoing has described horizontal n-channel IGBTs, the present invention is applicable also to other horizontal devices having MOS gate structures such as a horizontal MOS FET.

What is claimed is:

1. A semiconductor device comprising a horizontal unit semiconductor element, the horizontal unit semiconductor element comprising:
    a) a semiconductor substrate of a first conductivity type;
    b) a semiconductor region of a second conductivity type formed on the semiconductor substrate;
    c) a collector layer of the first conductivity type formed within the semiconductor region;
    d) a base layer of the first conductivity type having an endless shape and formed within the semiconductor region such that the base layer is off the collector layer but surrounds the collector layer;
    e) a first emitter layer of the second conductivity type formed in the base layer;
    f) an emitter electrode; and
    g) a second emitter layer of the first conductivity type formed surrounding the first emitter layer, and a cross-section of the second emitter layer is in contact with an entire bottom surface of the emitter electrode,
    the horizontal unit semiconductor element controlling, within a channel region formed in the base layer, movement of carriers between the first emitter layer and the collector layer,
    wherein the first emitter layer is formed by plural unit emitter layers which are formed along the base layer.

2. The semiconductor device according to claim 1, wherein the first emitter layer is formed by multiple rectangle unit emitter layers which are disposed equidistant from each other, and the width a of the unit emitter layers is wider than the gaps b between the unit emitter layers.

3. The semiconductor device according to claim 1, wherein a region of the first conductivity type is formed in contact with the bottom surface of the base layer.

4. A semiconductor device which comprises at least two semiconductor elements according to claim 1,
    wherein regions of the first conductivity type are formed within areas between the outer circumferences of the two adjacent semiconductor elements and a contact line common to the semiconductor elements.

5. A semiconductor device which comprises at least three semiconductor elements according to claim 1,
    wherein regions of the first conductivity type are formed within areas surrounded by the outer circumferences of the three adjacent semiconductor elements.

6. A semiconductor device comprising a horizontal unit semiconductor element, the horizontal unit semiconductor element comprising:
    a) a semiconductor substrate;
    b) a semiconductor region of a second conductivity type formed on the semiconductor substrate;
    c) an insulation film formed between the semiconductor substrate and the semiconductor region;
    d) a collector layer of a first conductivity type formed within the semiconductor region;
    e) a base layer of the first conductivity type having an endless shape and formed within the semiconductor region such that the base layer is off the collector layer but surrounds the collector layer;
    f) a first emitter layer of the second conductivity type formed in the base layer;
    g) an emitter electrode; and
    h) a second emitter layer of the first conductivity type formed surrounding the first emitter layer, and a cross-section of the second emitter layer is in contact with an entire bottom surface of the emitter electrode,
    the horizontal unit semiconductor element controlling, within a channel region formed in the base layer, movement of carriers between the first emitter layer and the collector layer,
    wherein the first emitter layer is formed by plural unit emitter layers which are formed along the base layer.

7. The semiconductor device according to claim 6, wherein the first emitter layer is formed by multiple rectangle unit emitter layers which are disposed equidistant from each other, and the width a of the unit emitter layers is wider than the gaps b between the unit emitter layers.

8. The semiconductor device according to claim 6, wherein a region of the first conductivity type is formed in contact with the bottom surface of the base layer.

9. A semiconductor device which comprises at least two semiconductor elements according to claim 6,
    wherein regions of the first conductivity type are formed within areas between the outer circumferences of the two adjacent semiconductor elements and a contact line common to the semiconductor elements.

10. A semiconductor device which comprises at least three semiconductor elements according to claim 6,
    wherein regions of the first conductivity type are formed within areas surrounded by the outer circumferences of the three adjacent semiconductor elements.

* * * * *